United States Patent
Lee et al.

(10) Patent No.: US 12,550,576 B2
(45) Date of Patent: Feb. 10, 2026

(54) DISPLAY DEVICE AND METHOD OF MANUFACTURING THE SAME

(71) Applicant: Samsung Display Co., LTD., Yongin-si (KR)

(72) Inventors: Sangshin Lee, Yongin-si (KR); Sanghoon Kim, Hwaseong-si (KR); Jongsung Park, Hwaseong-si (KR); Seungjin Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 504 days.

(21) Appl. No.: 18/101,042

(22) Filed: Jan. 24, 2023

(65) Prior Publication Data

US 2023/0292569 A1 Sep. 14, 2023

(30) Foreign Application Priority Data

Mar. 11, 2022 (KR) ........................ 10-2022-0031042

(51) Int. Cl.
*H10K 59/35* (2023.01)
*H10K 59/12* (2023.01)

(52) U.S. Cl.
CPC ....... *H10K 59/353* (2023.02); *H10K 59/1201* (2023.02); *H10K 59/351* (2023.02); *H10K 59/352* (2023.02)

(58) Field of Classification Search
CPC .......................... H10K 59/353; H10K 59/122
See application file for complete search history.

(56) References Cited

U.S. PATENT DOCUMENTS

| | | |
|---|---|---|
| 2009/0302331 A1 | 12/2009 | Smith et al. |
| 2015/0015465 A1 | 1/2015 | Gong |

(Continued)

FOREIGN PATENT DOCUMENTS

| | | | |
|---|---|---|---|
| CN | 114122093 A | * 3/2022 | ............ H10K 59/35 |
| EP | 2637209 B1 | 9/2013 | |

(Continued)

OTHER PUBLICATIONS

Machine translation, Li, Chinese Pat. Pub. No. CN114122093A, translation date: Jul. 21, 2025, Espacenet, all pages. (Year: 2025).*

(Continued)

*Primary Examiner* — Victoria K. Hall
(74) *Attorney, Agent, or Firm* — Womble Bond Dickinson (US) LLP

(57) ABSTRACT

A display device, includes: a plurality of unit areas, each of the plurality of unit areas including a first border having a hexagonal shape including: a first outer side; and a second outer side parallel to the first outer side, and having a length equal to a length of the first outer side; a pixel area in each of the plurality of unit areas, and including a second border having a hexagonal shape including: a first inner side adjacent to the first outer side; and a second inner side adjacent to the second outer side; and first to fourth sub-pixel areas in the pixel area. The second outer side of one unit area from among two unit areas adjacent to each other in a column direction from among the plurality of unit areas contacts the first outer side of another unit area from among the two unit areas.

22 Claims, 21 Drawing Sheets

(56) References Cited

U.S. PATENT DOCUMENTS

| | | |
|---|---|---|
| 2017/0249889 A1 | 8/2017 | Wang et al. |
| 2020/0168674 A1* | 5/2020 | Tan ...................... G02F 1/1333 |
| 2020/0235178 A1* | 7/2020 | Shin ...................... H10K 50/17 |
| 2022/0020827 A1* | 1/2022 | Liu .................. H10K 59/80516 |
| 2023/0189607 A1 | 6/2023 | Wang et al. |
| 2023/0209447 A1 | 6/2023 | Lee |

FOREIGN PATENT DOCUMENTS

| | | | | |
|---|---|---|---|---|
| JP | 2009-533810 A | | 9/2009 | |
| KR | 10-2014-0035239 A | | 3/2014 | |
| KR | 1020180014807 A | * | 2/2018 | ........... H10K 59/121 |
| KR | 10-2019-0117720 A | | 10/2019 | |
| KR | 10-2190843 B1 | | 12/2020 | |

OTHER PUBLICATIONS

Machine translation, Jo, Korean Pat. Pub. No. KR20180014807A, translation date: Jul. 16, 2025, Espacenet, all pages (Year: 2025).*

* cited by examiner

FIG. 14
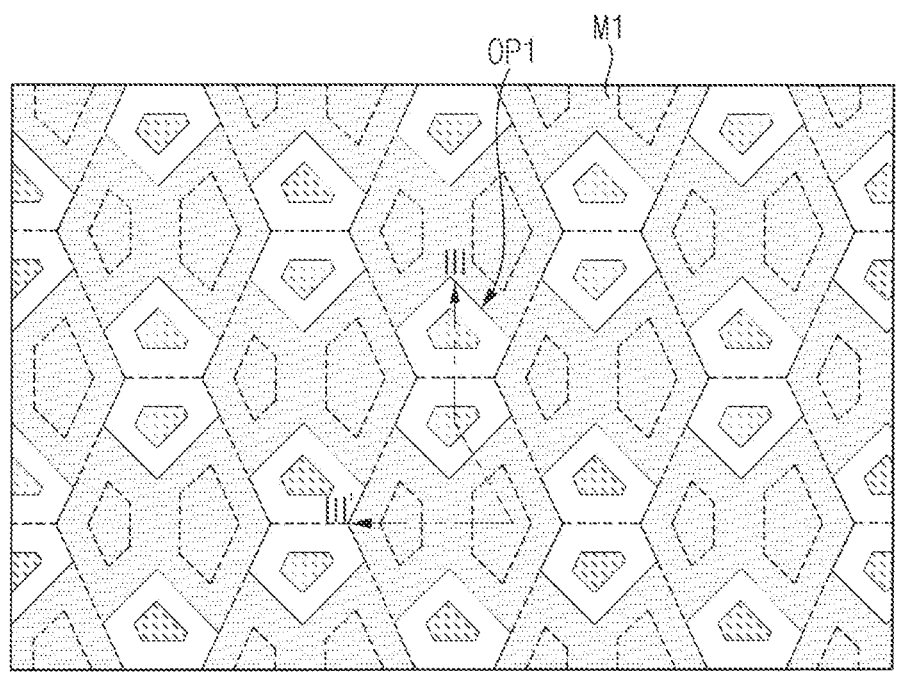
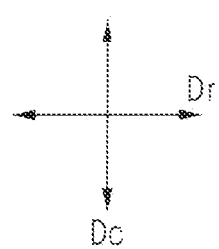

FIG. 16
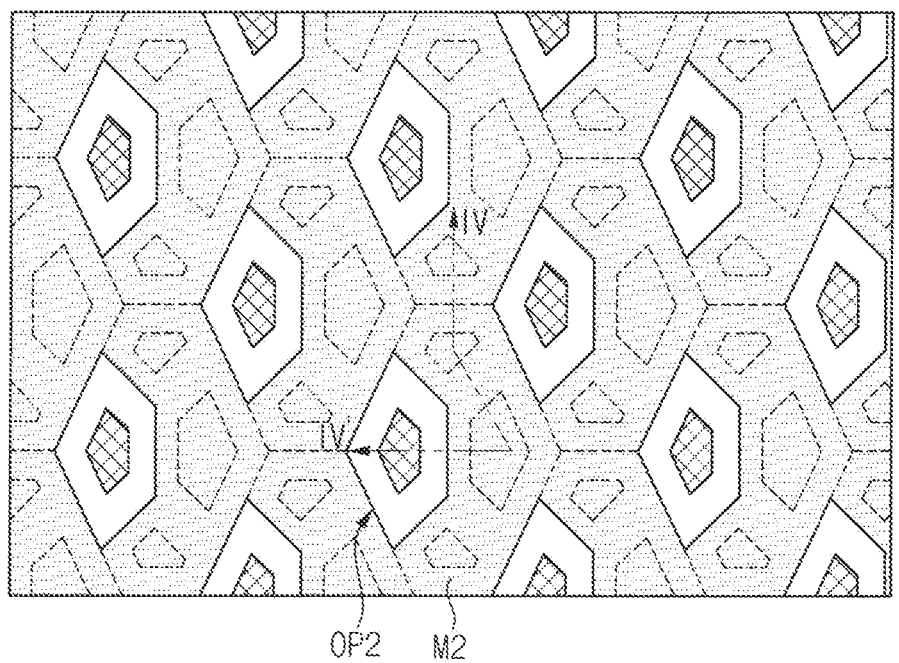
OP2   M2
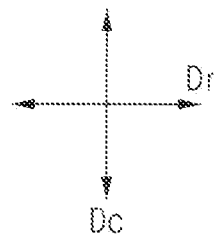

DISPLAY DEVICE AND METHOD OF MANUFACTURING THE SAME

CROSS-REFERENCE TO RELATED APPLICATION

This application claims priority to and the benefit of Korean Patent Application No. 10-2022-0031042, filed on Mar. 11, 2022, the entire content of which is incorporated by reference herein.

BACKGROUND

1. Field

Aspects of one or more embodiments of the present disclosure relate generally to an organic light emitting display device, and a method of manufacturing the same.

2. Description of the Related Art

An organic light emitting display device is a device for displaying an image, and may include a pixel, which is a minimum unit for displaying an image. The pixel may include a pixel electrode, a pixel defining layer defining an opening exposing the pixel electrode, an organic light emitting material disposed on the pixel electrode to correspond to the opening, a cathode electrode disposed on the organic light emitting material, and/or the like. The opening of the pixel defining layer may define an area and shape of the pixel by exposing the pixel electrode.

The above information disclosed in this Background section is for enhancement of understanding of the background of the present disclosure, and therefore, it may contain information that does not constitute prior art.

SUMMARY

Generally, an organic light emitting material constituting the pixel of the organic light emitting display device may be deposited using a mask including a fine metal mask (FMM). In this case, when a size of one pixel is designed to be relatively small in order to display a high-resolution image in a limited display area, a size of an opening pattern formed in the mask may be very small. Accordingly, it may be difficult to form the opening pattern in the mask, and thus, manufacturing yield of the mask may be reduced.

Further, in a high-resolution organic light emitting display device, a distance between two adjacent pixels may be relatively short. In this case, when the organic light emitting material is deposited in one opening of the pixel defining layer through the opening pattern of the mask, an end of the deposited organic light emitting material may invade another opening of the pixel defining layer, so that two or more organic light emitting materials may be stacked in the other opening of the pixel defining layer. Accordingly, light emitted by the pixel corresponding to the other opening may emit a plurality of different colored light, so that the colors of the light may be mixed with each other.

One or more embodiments of the present disclosure are directed to a display device for displaying a high-resolution image in a limited display area.

One or more embodiments of the present disclosure are directed to a method of manufacturing the display device.

According to one or more embodiments of the present disclosure, a display device includes: a plurality of unit areas, each of the plurality of unit areas including a first border having a hexagonal shape including: a first outer side; and a second outer side parallel to the first outer side, and having a length equal to a length of the first outer side; a pixel area in each of the plurality of unit areas, and including a second border having a hexagonal shape including: a first inner side adjacent to the first outer side; and a second inner side adjacent to the second outer side; a first sub-pixel area in the pixel area, a border of the first sub-pixel area including the first inner side; a first light emitting material in the first sub-pixel area; a second sub-pixel area in the pixel area, a border of the second sub-pixel area including a first portion of the second border; a second light emitting material in the second sub-pixel area; a third sub-pixel area in the pixel area, a border of the third sub-pixel area including a second portion of the second border different from the first portion of the second border; a third light emitting material in the third sub-pixel area; a fourth sub-pixel area in the pixel area, a border of the fourth sub-pixel area including the second inner side; and the first light emitting material in the fourth sub-pixel area. The second outer side of one unit area from among two unit areas adjacent to each other in a column direction from among the plurality of unit areas contacts the first outer side of another unit area from among the two unit areas.

In an embodiment, a plurality of pixel columns defined by unit areas from among the plurality of unit areas arranged in the column direction may be interlocked with each other, and may be arranged along a row direction crossing the column direction.

In an embodiment, the first border may be point-symmetric with respect to a reference point surrounded by the first border.

In an embodiment, the border of the first sub-pixel area and the border of the second sub-pixel area may be point-symmetric with each other with respect to the reference point.

In an embodiment, the first outer side may be parallel to a row direction crossing the column direction; and the first border may be line-symmetric with respect to each of a first reference line passing through the reference point and extending in the row direction, and a second reference line passing through the reference point and extending in the column direction.

In an embodiment, the border of the first sub-pixel area and the border of the fourth sub-pixel area may be line-symmetric with each other with respect to the first reference line.

In an embodiment, each of all interior angles of the first border and all interior angles of the second border may be less than 180 degrees.

In an embodiment, the first border may include: a third outer side contacting one end of the first outer side; a fourth outer side connecting the third outer side to one end of the second outer side; a fifth outer side contacting another end of the first outer side opposite to the one end of the first outer side; and a sixth outer side connecting the fifth outer side to another end of the second outer side opposite to the one end of the second outer side.

In an embodiment, the second border may include: a third inner side contacting one end of the first inner side; a fourth inner side connecting the third inner side to one end of the second inner side; a fifth inner side contacting another end of the first inner side opposite to the one end of the first inner side; and a sixth inner side connecting the fifth inner side to another end of the second inner side opposite to the one end of the second inner side.

In an embodiment, the first inner side and the first outer side may be parallel to each other; the second inner side and the second outer side may be parallel to each other; the third inner side and the third outer side may be parallel to each other; the fourth inner side and the fourth outer side may be parallel to each other; the fifth inner side and the fifth outer side may be parallel to each other; and the sixth inner side and the sixth outer side may be parallel to each other.

In an embodiment, the first inner side and the first outer side may be spaced from each other by a first distance; the second inner side and the second outer side may be spaced from each other by a second distance; the third inner side and the third outer side may be spaced from each other by a third distance; the fourth inner side and the fourth outer side may be spaced from each other by a fourth distance; the fifth inner side and the fifth outer side may be spaced from each other by a fifth distance; the sixth inner side and the sixth outer side may be spaced from each other by a sixth distance; and the first distance, the second distance, the third distance, the fourth distance, the fifth distance, and the sixth distance may be equal to each other.

In an embodiment, the border of the second sub-pixel area may include a portion of the third inner side adjacent to the fourth inner side, and a portion of the fourth inner side adjacent to the third inner side; and the border of the third sub-pixel area may include a portion of the fifth inner side adjacent to the sixth inner side, and a portion of the sixth inner side adjacent to the fifth inner side.

In an embodiment, each of the border of the first sub-pixel area and the border of the fourth sub-pixel area may have an N-sided polygon shape, where N is equal to 3, 4, 5, or 6.

In an embodiment, each of the border of the second sub-pixel area and the border of the third sub-pixel area may have an M-sided polygon shape, where M is equal to 4 or 5.

In an embodiment, an area of the first sub-pixel area may be the same size as that of an area of the fourth sub-pixel area.

In an embodiment, an area of the first sub-pixel area may be smaller than an area of the second sub-pixel area, and smaller than an area of the third sub-pixel area; and an area of the fourth sub-pixel area may be smaller than the area of the second sub-pixel area, and smaller than the area of the third sub-pixel area.

In an embodiment, an area of the third sub-pixel area may be larger than an area of the second sub-pixel area.

In an embodiment, the first light emitting material may be configured to emit light having a first color; the second light emitting material may be configured to emit light having a second color different from the first color; and the third light emitting material may be configured to emit light having a third color different from each of the first color and the second color.

In an embodiment, the light of the first color may have a peak wavelength in a range of 510 nanometers or more, and 550 nanometers or less; the light of the second color may have a peak wavelength in a range of 610 nanometers or more, and 650 nanometers or less; and the light of the third color may have a peak wavelength in a range of 440 nanometers or more, and 480 nanometers or less.

According to one or more embodiments of the present disclosure, a method of manufacturing a display device, includes: forming a pixel defining layer including: a plurality of unit areas, each of the plurality of unit areas including a first border having a hexagonal shape including: a first outer side; and a second outer side parallel to the first outer side, and having a length equal to a length of the first outer side; and a pixel area disposed in each of the plurality of unit areas, and including a second border having a hexagonal shape including: a first inner side adjacent to the first outer side; and a second inner side adjacent to the second outer side; forming a plurality of pixel openings in the pixel defining layer, the plurality of pixel openings including: a first pixel opening defining a first sub-pixel area in the pixel area, a border of the first sub-pixel area including the first inner side; a second pixel opening defining a second sub-pixel area in the pixel area, a border of the second sub-pixel area including a first portion of the second border; a third pixel opening defining a third sub-pixel area in the pixel area, a border of the third sub-pixel area including a second portion of the second border different from the first portion of the second border; and a fourth pixel opening defining a fourth sub-pixel area in the pixel area, a border of the fourth sub-pixel area including the second inner side; depositing a first light emitting material in the first pixel opening and the fourth pixel opening; depositing a second light emitting material in the second pixel opening; and depositing a third light emitting material in the third pixel opening. The second outer side of one unit area from among two unit areas adjacent to each other in a column direction from among the plurality of unit areas contacts the first outer side of another unit area from among the two unit areas.

In an embodiment, the depositing of the first light emitting material may include disposing a first mask defining a first opening pattern on the pixel defining layer; the depositing of the second light emitting material may include disposing a second mask defining a second opening pattern on the pixel defining layer; and the depositing of the third light emitting material may include disposing a third mask defining a third opening pattern on the pixel defining layer.

In an embodiment, the first opening pattern may concurrently expose the fourth sub-pixel area of the one unit area from among the two unit areas and the first sub-pixel area of the other unit area from among the two unit areas.

In an embodiment, an area of the first opening pattern may be 80% or more, and 120% or less of an area of the third opening pattern; and an area of the second opening pattern may be 80% or more, and 120% or less of the area of the third opening pattern.

According to various embodiments of the present disclosure, the display device may include a plurality of unit areas, a pixel area disposed in each of the plurality of unit areas, and first to fourth sub-pixel areas disposed in the pixel areas. Accordingly, a high-resolution image may be displayed in a display area having a limited area.

According to various embodiments of the present disclosure, the method of manufacturing the display device may include depositing a first light emitting material in first and fourth pixel openings corresponding to first and fourth sub-pixel areas, depositing a second light emitting material in a second pixel opening corresponding to a second sub-pixel area, and depositing a third light emitting material in a third pixel opening corresponding to a third sub-pixel area. In this case, the first light emitting material may be concurrently (e.g., simultaneously) deposited in the fourth pixel opening of one unit area of two adjacent unit areas, and the first pixel opening of another unit area of the two adjacent unit areas. Accordingly, yield of the deposition process may be improved.

It is to be understood that both the foregoing general description and the following detailed description are provided as examples, and are intended to provide a further description and explanation of the aspects and features of the present disclosure as claimed.

BRIEF DESCRIPTION OF THE DRAWINGS

The above and other aspects and features of the present disclosure will be more clearly understood from the following detailed description of the illustrative, non-limiting embodiments with reference to the accompanying drawings.

FIGS. 12-19 are diagrams illustrating a method of manufacturing the display device of FIG. 1.

DETAILED DESCRIPTION

Figure 1:
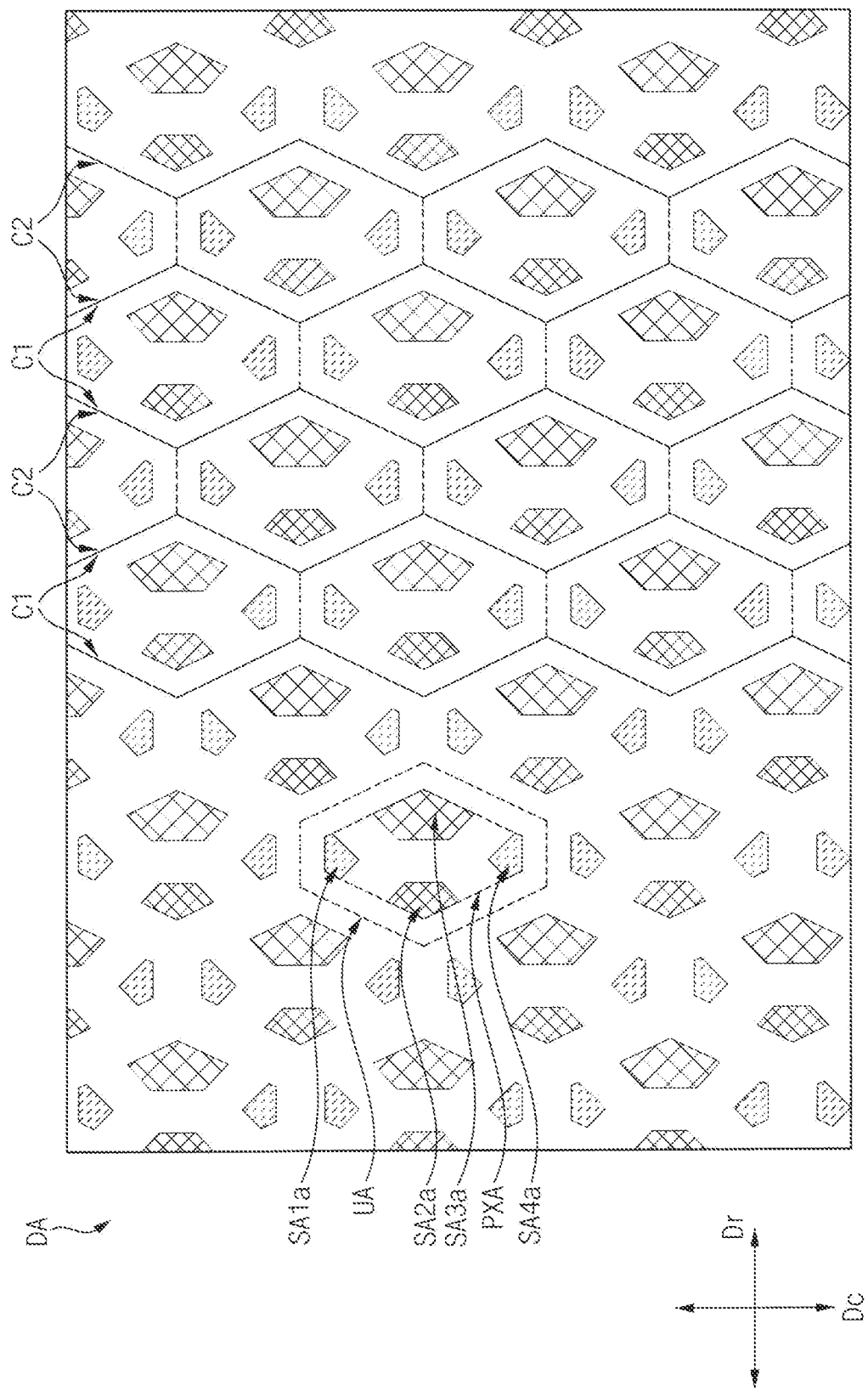
FIG. 1 is a plan view illustrating a display device according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

In the figures, the x-axis, the y-axis, and the z-axis are not limited to three axes of the rectangular coordinate system, and may be interpreted in a broader sense. For example, the x-axis, the y-axis, and the z-axis may be perpendicular to or substantially perpendicular to one another, or may represent different directions from each other that are not perpendicular to one another.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
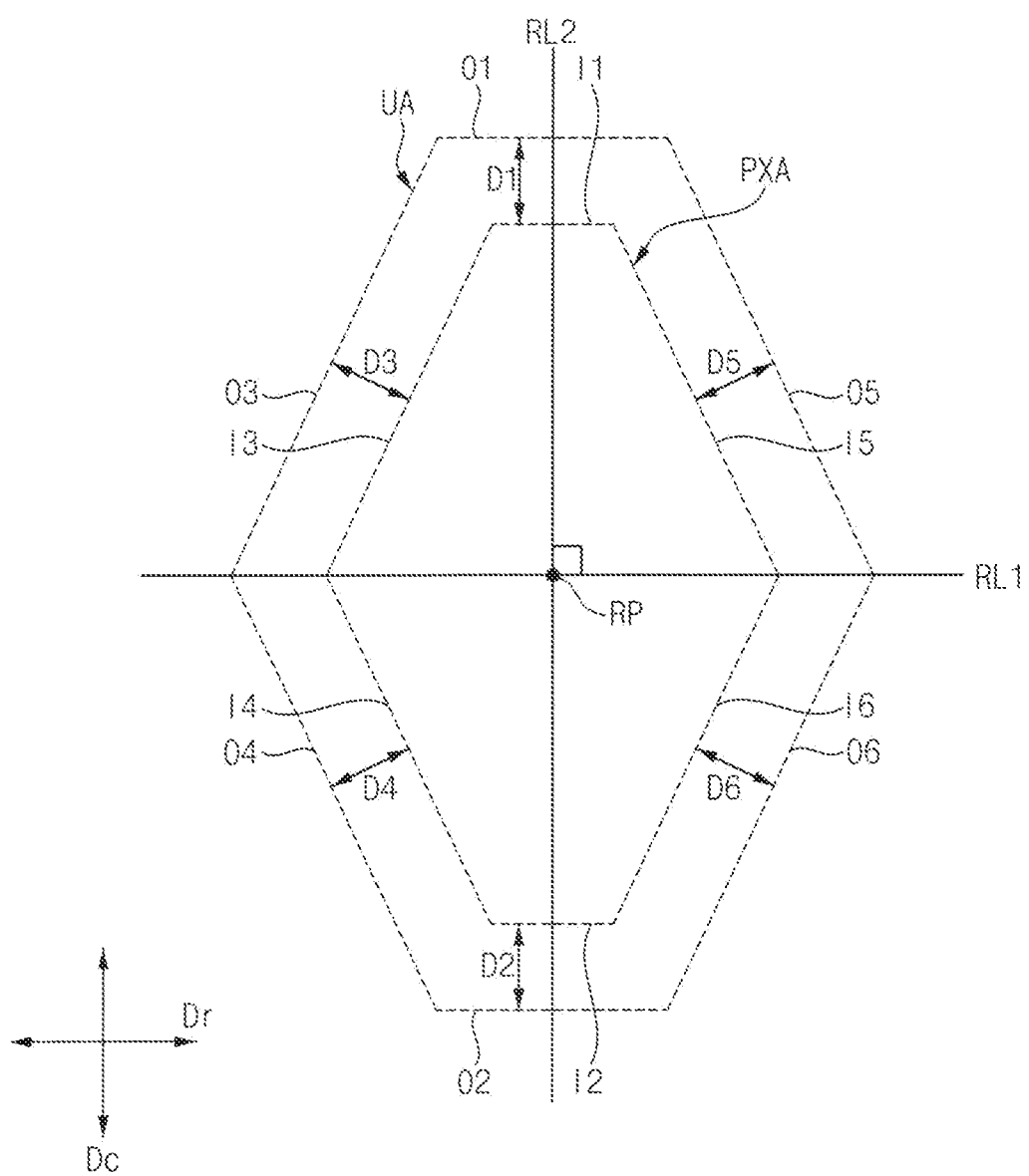
FIG. 2 is a diagram illustrating a unit area and a pixel area included in the display device of FIG. 1.

FIG. 1 is a plan view illustrating a display device according to an embodiment. FIG. 2 is a diagram illustrating a unit area and a pixel area included in the display device of FIG. 1.

Referring to FIG. 1 and FIG. 2, a display device may include a display area DA. The display area DA may be an area for displaying an image. In FIG. 1, a portion of the display area DA is illustrated for convenience of illustration.

The display area DA may be divided into a plurality of unit areas UA. The plurality of unit areas UA may be defined as a set of minimum units capable of filling the display area DA without blanking or overlapping with each other. Each of the plurality of unit areas UA may have the same or substantially the same shape as each other. In more detail, in any one unit area UA from among the plurality of unit areas UA, the unit area UA may have a hexagonal shape in which each of all interior angles is less than 180 degrees.

Each of the plurality of unit areas UA may have a first border defining a boundary of each of the plurality of unit areas UA. The first border may be an imaginary line that is not recognized by a user of the display device.

In an embodiment, the first border may be point-symmetric with respect to a reference point RP located within (e.g., at a center of) the unit area UA. In this case, the phrase "the reference point RP is located within the unit area UA" may have the same or substantially the same meaning as the phrase "the reference point RP is surrounded (e.g., around a periphery thereof) by the first border". In addition, the first border may be line-symmetric with respect to each of a first reference line RL1 passing (e.g., extending) through the reference point in a row direction Dr, and a second reference line RL2 passing (e.g., extending) through the reference point in a column direction Dc crossing (e.g., perpendicular to or substantially perpendicular to) the row direction Dr.

In an embodiment, the first border may have a hexagonal shape including a first outer side O1, a second outer side O2, a third outer side O3, a fourth outer side O4, a fifth outer side O5, and a sixth outer side O6.

A length of the first outer side O1 may be the same or substantially the same as a length of the second outer side O2, and the first outer side O1 may be parallel to or substantially parallel to the second outer side O2. In addition, the first outer side O1 may be parallel to or substantially parallel to the row direction Dr. Accordingly, the second outer side O2 of one unit area UA from among two unit areas UA that are adjacent to each other in the column direction Dc from among the plurality of unit areas UA may contact the first outer side O1 of the other unit area UA from among the two unit areas UA.

The third outer side O3 and the fourth outer side O4 may connect one end of the first outer side O1 and one end of the second outer side O2 to each other. The fifth outer side O5 and the sixth outer side O6 may connect the other end of the first outer side O1 opposite to the one end of the first outer side O1 and the other end of the second outer side O2 opposite to the one end of the second outer side O2 to each other.

A pixel area PXA may be disposed in each of the plurality of unit areas UA. The pixel area PXA may have a hexagonal shape in which a size of each of all interior angles is less than 180 degrees.

The pixel area PXA may have a second border defining a boundary of the pixel area PXA. The second border may be an imaginary line that is not recognized by a user of the display device. Because the pixel area PXA is disposed in each of the plurality of unit areas UA, the second border may be disposed inside (e.g., within) the first border. In this case, the second border may be spaced apart from the first border.

In an embodiment, the second border may be point-symmetric with respect to the reference point RP located within (e.g., at a center of) the unit area UA (e.g., or within (e.g., at a center of) the pixel area PXA). In addition, the second border may be line-symmetric with respect to each of the first reference line RL1 passing (e.g., extending) through the reference point in the row direction Dr and the second reference line RL2 passing (e.g., extending) through the reference point in the column direction Dc.

In an embodiment, the second border may have a hexagonal shape including a first inner side I1 adjacent to the first outer side O1, a second inner side I2 adjacent to the second outer side O2, a third inner side I3 adjacent to the third outer side O3, a fourth inner side I4 adjacent to the fourth outer side O4, a fifth inner side I5 adjacent to the fifth outer side O5, and a sixth inner side I6 adjacent to the sixth outer side O6.

The third inner side I3 and the fourth inner side I4 may connect one end of the first inner side I1 and one end of the second inner side I2 to each other. The fifth inner side I5 and the sixth inner side I6 may connect the other end of the first inner side I1 opposite to the one end of the first inner side I1 and the other end of the second inner side I2 opposite to the one end of the second inner side I2 to each other.

In an embodiment, the first inner side I1 may be parallel to or substantially parallel to the first outer side O1, the second inner side I2 may be parallel to or substantially parallel to the second outer side O2, the third inner side I3 may be parallel to or substantially parallel to the third outer side O3, the fourth inner side I4 may be parallel to or substantially parallel to the fourth outer side O4, the fifth inner side I5 may be parallel to or substantially parallel to the fifth outer side O5, and the sixth inner side I6 may be parallel to or substantially parallel to the sixth outer side O6.

In this case, the first inner side I1 may be spaced apart from the first outer side O1 by a first distance D1, the second inner side I2 may be spaced apart from the second outer side O2 by a second distance D2, the third inner side I3 may be spaced apart from the third outer side O3 by a third distance D3, the fourth inner side I4 may be spaced apart from the fourth outer side O4 by a fourth distance D4, the fifth inner side I5 may be spaced apart from the fifth outer side O5 by a fifth distance D5, and the sixth inner side I6 may be spaced apart from the sixth outer side O6 by a sixth distance D6.

In an embodiment, the first distance D1, the second distance D2, the third distance D3, the fourth distance D4, the fifth distance D5, and the sixth distance D6 may be identical or substantially identical to each other.

A first sub-pixel area SA1a, a second sub-pixel area SA2a, a third sub-pixel area SA3a, and a fourth sub-pixel area SA4a may be disposed in the pixel area PXA. Each of the first to fourth sub-pixel areas SA1a, SA2a, SA3a, and SA4a may be a minimum unit for emitting or substantially emitting light. For example, each of the first to fourth sub-pixel areas SA1a, SA2a, SA3a, and SA4a may correspond to an opening of a pixel defining layer (e.g., refer to PDL of FIG. 4), and a light emitting material may be disposed in the opening. This will be described in more detail below with reference to FIG. 3 and FIG. 4.

A border of the first sub-pixel area SA1a may include the first inner side I1. A border of the fourth sub-pixel area SA4a may include the second inner side I2. Accordingly, in one or more embodiments of the present disclosure, the fourth sub-pixel area SA4a disposed in one unit area UA from among two unit areas UA that are adjacent to each other in the column direction Dc from among the plurality of unit areas UA may be adjacent to the first sub-pixel area SA1a of the other unit area UA from among the two unit areas UA.

A border of the second sub-pixel area SA2a may include a portion of the second border. For example, the second sub-pixel area SA2a may include a portion of the third inner side I3 adjacent to the fourth inner side I4, and a portion of the fourth inner side I4 adjacent to the third inner side I3.

A border of the third sub-pixel area SA3a may include another portion of the second border. For example, the third sub-pixel area SA3a may include a portion of the fifth inner side I5 adjacent to the sixth inner side I6, and a portion of the sixth inner side I6 adjacent to the fifth inner side I5.

Unit areas UA arranged in the column direction Dc from among the plurality of unit areas UA may define a plurality of pixel columns. For example, the plurality of pixel columns may include a first pixel column C1, and a second pixel column C2 adjacent to the first pixel column C1 in the row direction Dr. The second pixel column C2 may be a pixel column in which the first pixel column C1 is shifted by a suitable distance (e.g., a predetermined distance) in the column direction Dc.

The plurality of pixel columns may be interlocked with one another, and arranged along the row direction Dr. For example, the first pixel column C1 and the second pixel column C2 may be interlocked with each other, and alternately arranged along the row direction Dr.

Figure 3:
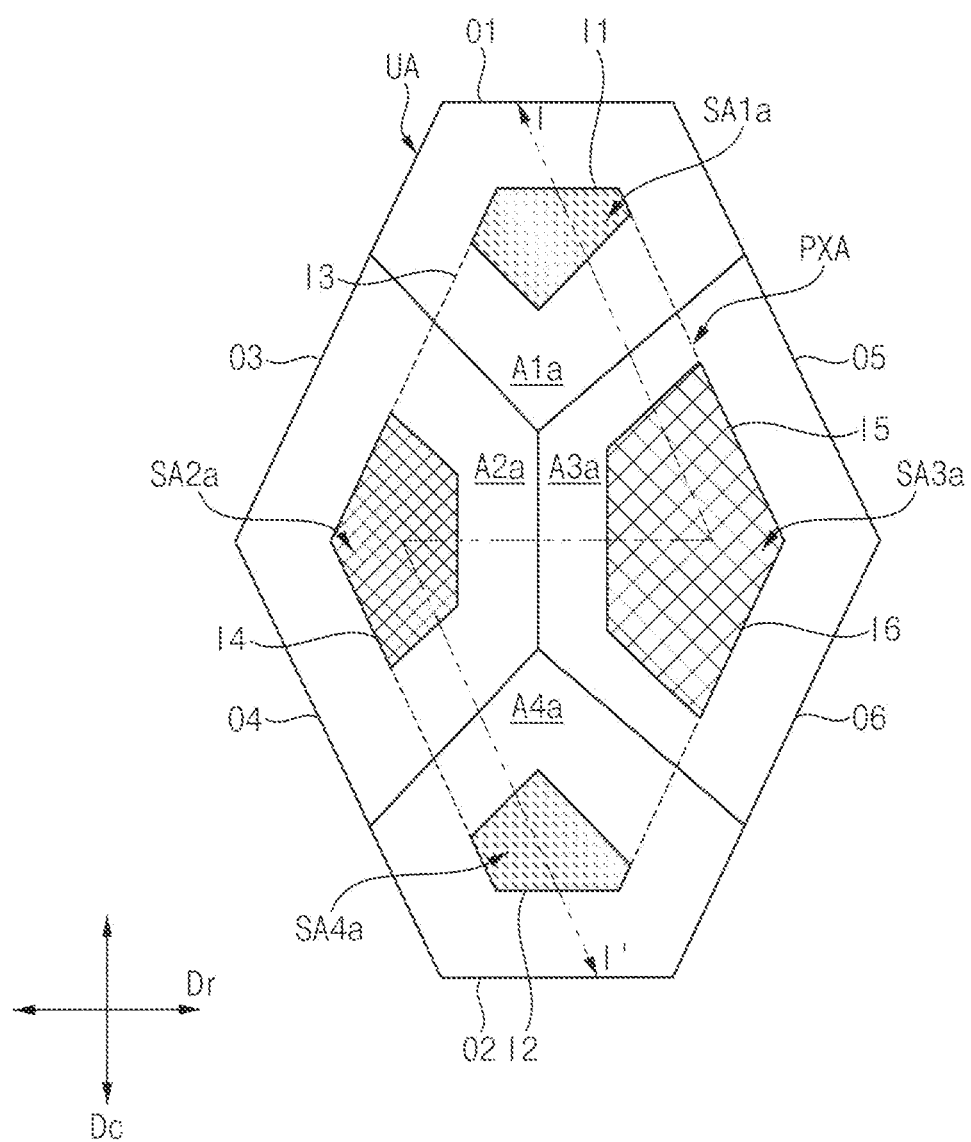
FIG. 3 is a plan view illustrating a sub-pixel area according to a first embodiment.
Figure 4:
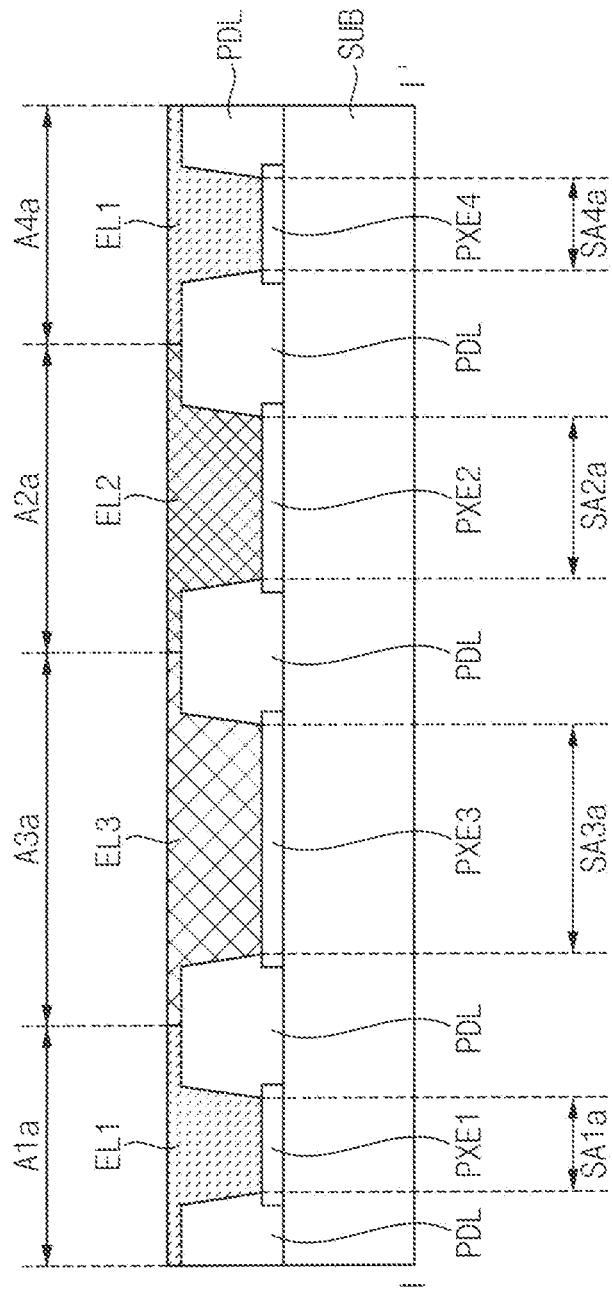
FIG. 4 is a cross-sectional view taken along the line I-I' of FIG. 3.

FIG. 3 is a plan view illustrating a sub-pixel area according to a first embodiment. FIG. 4 is a cross-sectional view taken along the line I-I' of FIG. 3.

The unit area UA, the pixel area PXA, and the first to fourth sub-pixel areas SA1a, SA2a, SA3a, and SA4a illustrated in FIG. 3 may be the same or substantially the same as the unit area UA, the pixel area PXA, and the first to fourth sub-pixel areas SA1a, SA2a, SA3a, and SA4a described above with reference to FIG. 1 and FIG. 2, and thus, redundant description thereof may not be repeated.

Referring to FIG. 3 and FIG. 4, the display device may include a substrate SUB, first to fourth pixel electrodes PXE1, PXE2, PXE3, and PXE4, a pixel defining layer PDL, and first to third light emitting materials EL1, EL2, and EL3.

The substrate SUB may include a plurality of insulation layers, and a plurality of transistors. In an embodiment, the substrate SUB may include a material having flexibility, so as to be repeatedly folded and/or unfolded.

The first to fourth pixel electrodes PXE1, PXE2, PXE3, and PXE4 may be disposed on the substrate SUB. The first to fourth pixel electrodes PXE1, PXE2, PXE3, and PXE4 may be disposed to be spaced apart from each other. The first to fourth pixel electrodes PXE1, PXE2, PXE3, and PXE4 may be disposed in the unit area UA. Each of the first to fourth pixel electrodes PXE1, PXE2, PXE3, and PXE4 may be electrically connected to the plurality of transistors. In an embodiment, each of the first to fourth pixel electrodes PXE1, PXE2, PXE3, and PXE4 may be referred to as an anode electrode.

The pixel defining layer PDL may be disposed on the first to fourth pixel electrodes PXE1, PXE2, PXE3, and PXE4. The pixel defining layer PDL may include an organic material. The pixel defining layer PDL may define an opening exposing each of the first to fourth pixel electrodes PXE1, PXE2, PXE3, and PXE4. The opening may include a first pixel opening exposing the first pixel electrode PXE1, a second pixel opening exposing the second pixel electrode PXE2, a third pixel opening exposing the third pixel electrode PXE3, and a fourth pixel opening exposing the fourth pixel electrode PXE4.

The first to third light emitting materials EL1, EL2, and EL3 may include a suitable material for emitting light. For example, the first to third light emitting materials EL1, EL2, and EL3 may include an organic light emitting material. The first to third light emitting materials EL1, EL2, and EL3 may be disposed in the opening. In more detail, the first light emitting material EL1 may be disposed in the first pixel opening and the fourth pixel opening, the second light emitting material EL2 may be disposed in the second pixel opening, and the third light emitting material EL3 may be disposed in the third pixel opening.

In an embodiment, the first to third light emitting materials EL1, EL2, and EL3 may be further disposed on the pixel defining layer PDL. In this case, an area in which the first light emitting material EL1 may be located may be a first area A1a and a fourth area A4a, an area in which the second light emitting material EL2 may be located may be a second area A2a, and an area in which the third light emitting material EL3 may be located may be a third area A3a. The first to fourth areas A1a, A2a, A3a, and A4a may be disposed in the unit area UA. In an embodiment, an entire outer border of the first to fourth areas A1a, A2a, A3a, and A4a may be the same or substantially the same as the first border of the unit area UA.

In an embodiment, the first light emitting material EL1 may emit light having a first color, the second light emitting material EL2 may emit light having a second color, and the third light emitting material EL3 may emit light having a third color. In this case, the light of the first color may have a peak wavelength in a range of about 510 nm or more and about 550 nm or less, the light of the second color may have a peak wavelength in a range of about 610 nm or more and about 650 nm or less, and the light of the third color may have a peak wavelength in a range of about 440 nm or more and about 480 nm or less. In other words, the first color may be green, the second color may be red, and the third color may be blue.

Although not shown in FIG. 3 and FIG. 4, a common electrode covering the first to third light emitting materials EL1, EL2, and EL3 may be disposed on the pixel defining layer PDL. The common electrode may include a transparent conductive material. In an embodiment, the common electrode may be referred to as a cathode electrode.

The first sub-pixel area SA1a may be defined as an area corresponding to the first pixel opening. The first sub-pixel area SA1a may be an area in which light is emitted or substantially emitted from the first light emitting material EL1 among the first area A1a.

The first sub-pixel area SA1a may have a pentagonal shape. In this case, a border of the first sub-pixel area SA1a may include the first inner side I1, a portion of the third inner side I3 adjacent to the first inner side I1, and a portion of the fifth inner side I5 adjacent to the first inner side I1.

When the first sub-pixel area SA1a has the pentagonal shape, the first area A1a may have a pentagonal shape. In this case, a border of the first area A1a may surround (e.g., around a periphery of) the border of the first sub-pixel area SA1a.

The second sub-pixel area SA2a may be defined as an area corresponding to the second pixel opening. The second sub-pixel area SA2a may be an area in which light is emitted or substantially emitted from the second light emitting material EL2 among the second area A2a.

The second sub-pixel area SA2a may have a pentagonal shape. In this case, a border of the second sub-pixel area SA2a may include a portion of the third inner side I3 adjacent to the fourth inner side I4, and a portion of the fourth inner side I4 adjacent to the third inner side I3.

When the second sub-pixel area SA2a has the pentagonal shape, the second area A2a may have a pentagonal shape. In this case, a border of the second area A2a may surround (e.g., around a periphery of) the border of the second sub-pixel area SA2a.

The third sub-pixel area SA3a may be defined as an area corresponding to the third pixel opening. The third sub-pixel area SA3a may be an area in which light is emitted or substantially emitted from the third light emitting material EL3 among the third area A3a.

The third sub-pixel area SA3a may have a pentagonal shape. In this case, a border of the third sub-pixel area SA3a may include a portion of the fifth inner side I5 adjacent to the sixth inner side I6, and a portion of the sixth inner side I6 adjacent to the fifth inner side I5.

When the third sub-pixel area SA3a has the pentagonal shape, the third area A3a may have a pentagonal shape. In this case, a border of the third area A3a may surround (e.g., around a periphery of) the third sub-pixel area SA3a.

The fourth sub-pixel area SA4a may be defined as an area corresponding to the fourth pixel opening. The fourth sub-pixel area SA4a may be an area in which light is emitted or substantially emitted from the first light emitting material EL1 among the fourth area A4a.

The fourth sub-pixel area SA4a may have a pentagonal shape. In this case, a border of the fourth sub-pixel area SA4a may include the second inner side I2, a portion of the fourth inner side I4 adjacent to the second inner side I2, and a portion of the sixth inner side I6 adjacent to the second inner side I2.

In an embodiment, the border of the fourth sub-pixel area SA4a and the border of the first sub-pixel area SA1a may be line-symmetric with each other with respect to the first reference line RL1 described above with reference to FIG. 2.

When the fourth-sub-pixel area SA4a has the pentagonal shape, the fourth area A4a may have a pentagonal shape. In this case, a border of the fourth area SA4a may surround (e.g., around a periphery of) the fourth sub-pixel area SA4a.

In order to increase or maximize luminous efficiency of the first to third light emitting materials EL1, EL2, and EL3, each of the first to fourth sub-pixel areas SA1a, SA2a, SA3a, and SA4a may have various suitable areas.

In an embodiment, an area of the first sub-pixel area SA1a may be the same or substantially the same as an area of the fourth sub-pixel area SA4a.

In an embodiment, an area of the second sub-pixel area SA2a may be different from an area of the third sub-pixel area SA3a. For example, the area of the third sub-pixel area SA3a may be larger than the area of the second sub-pixel area SA2a. As another example, the area of the third sub-pixel area SA3a may be smaller than the area of the second sub-pixel area SA2a.

In an embodiment, the area of the first sub-pixel area SA1a may be smaller than the area of the second sub-pixel area SA2a, and may be smaller than the area of the third sub-pixel area SA3a. In addition, the area of the fourth sub-pixel area SA4a may be smaller than the area of the second sub-pixel area SA2a, and may be smaller than the area of the third sub-pixel area SA3a.

Figure 5:
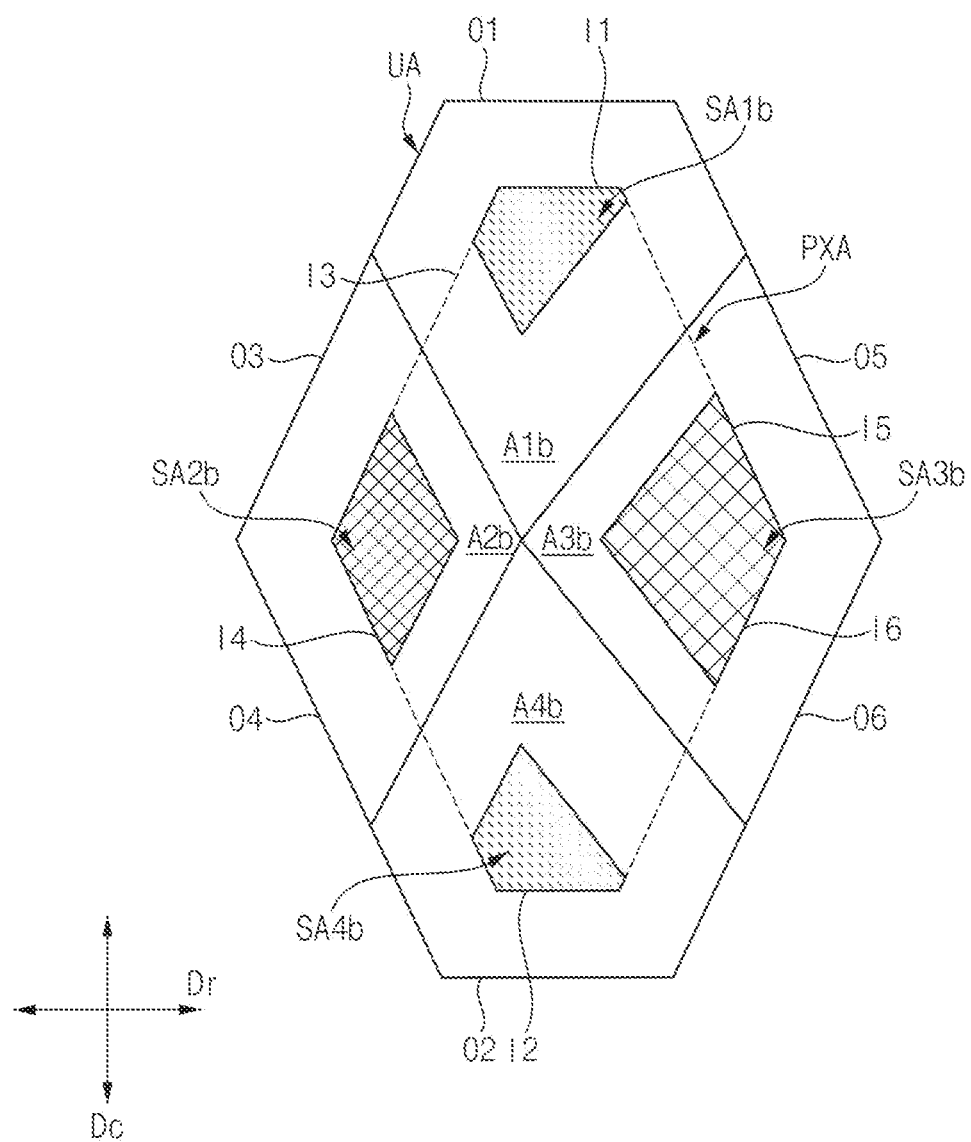
FIG. 5 is a plan view illustrating a sub-pixel area according to a second embodiment.

FIG. 5 is a plan view illustrating a sub-pixel area according to a second embodiment.

The unit area UA and the pixel area PXA illustrated in FIG. 5 may be the same or substantially same as (or similar to) the unit area UA and the pixel area PXA described above with reference to FIG. 1 and FIG. 2, and thus, redundant description thereof may not be repeated.

Referring to FIG. 5, first to fourth sub-pixel areas SA1b, SA2b, SA3b, and SA4b according to the second embodiment may be the same or substantially the same as (or similar to) the first to fourth sub-pixel areas SA1a, SA2a, SA3a, and SA4a described above with reference to FIG. 3 and FIG. 4, except for a planar shape thereof. In addition, first to fourth areas A1b, A2b, A3b, and A4b according to the second embodiment may be the same or substantially same as the first to fourth areas A1a, A2a, A3a, and A4a described above with reference to FIG. 3 and FIG. 4, except for a planar shape thereof. Accordingly, redundant description thereof may not be repeated, and the differences therebetween may be mainly described hereinafter.

The first sub-pixel area SA1b may have a pentagonal shape. In this case, a border of the first sub-pixel area SA1b may include the first inner side I1, a portion of the third inner side I3 adjacent to the first inner side I1, and a portion of the fifth inner side I5 adjacent to the first inner side I1.

When the first sub-pixel area SA1b has the pentagonal shape, the first area A1b may have a pentagonal shape. In this case, a border of the first area A1b may surround (e.g., around a periphery of) the border of the first sub-pixel area SA1b.

The second sub-pixel area SA2b may have a quadrangular shape. In this case, a border of the second sub-pixel area SA2b may include a portion of the third inner side I3 adjacent to the fourth inner side I4, and a portion of the fourth inner side I4 adjacent to the third inner side I3.

When the second sub-pixel area SA2b has the quadrangular shape, the second area A2b may have a quadrangular shape. In this case, a border of the second area A2b may surround (e.g., around a periphery of) the border of the second sub-pixel area SA2b.

The third sub-pixel area SA3b may have a quadrangular shape. In this case, a border of the third sub-pixel area SA3b may include a portion of the fifth inner side I5 adjacent to the sixth inner side I6, and a portion of the sixth inner side I6 adjacent to the fifth inner side I5.

When the third sub-pixel area SA3b has the quadrangular shape, the third area A3b may have a quadrangular shape. In this case, a border of the third area A3b may surround (e.g., around a periphery of) the border of the third sub-pixel area SA3b.

The fourth sub-pixel area SA4b may have a pentagonal shape. In this case, a border of the fourth sub-pixel area SA4b may include the second inner side I2, a portion of the fourth inner side I4 adjacent to the second inner side I2, and a portion of the sixth inner side I6 adjacent to the second inner side I2.

In an embodiment, the border of the fourth sub-pixel area SA4b and the border of the first sub-pixel area SA1b may be line-symmetric with each other with respect to the first reference line RL1 described above with reference to FIG. 2.

When the fourth sub-pixel area SA4b has the pentagonal shape, the fourth area A4b may have a pentagonal shape. In this case, a border of the fourth area A4b may surround (e.g., around a periphery of) the border of the fourth sub-pixel area SA4b.

Each of the first to fourth sub-pixel areas SA1b, SA2b, SA3b, and SA4b may have various suitable areas.

In an embodiment, an area of the first sub-pixel area SA1b may be the same or substantially the same as an area of the fourth sub-pixel area SA4b.

In an embodiment, an area of the second sub-pixel area SA2b may be different from an area of the third sub-pixel area SA3b. For example, the area of the third sub-pixel area SA3b may be larger than the area of the second sub-pixel area SA2b. As another example, the area of the third sub-pixel area SA3b may be smaller than the area of the second sub-pixel area SA2b.

In an embodiment, the area of the first sub-pixel area SA1b may be smaller than the area of the second sub-pixel area SA2b, and may be smaller than the area of the third sub-pixel area SA3b. In addition, the area of the fourth sub-pixel area SA4b may be smaller than the area of the second sub-pixel area SA2b, and may be smaller than the area of the third sub-pixel area SA3b.

Figure 6:
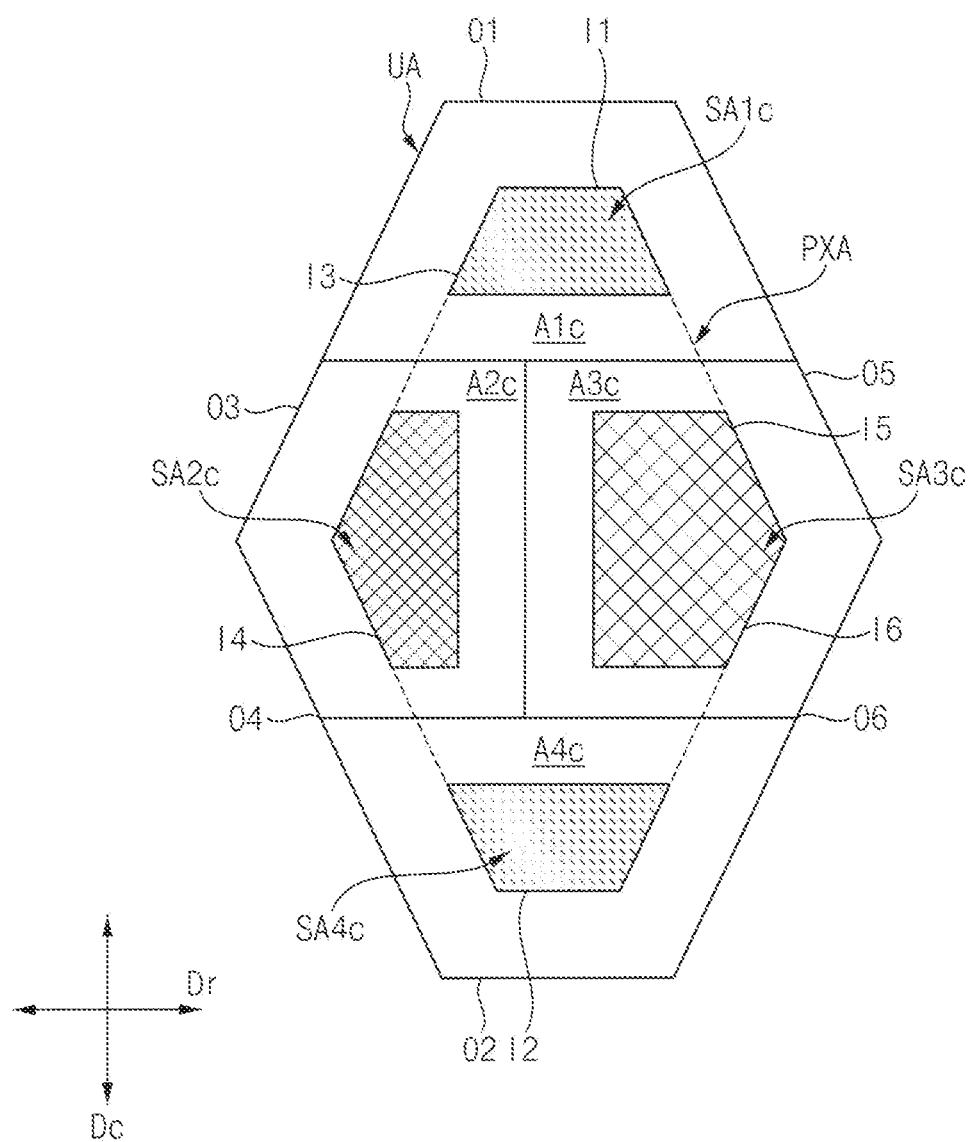
FIG. 6 is a plan view illustrating a sub-pixel area according to a third embodiment.

FIG. 6 is a plan view illustrating a sub-pixel area according to a third embodiment.

The unit area UA and the pixel area PXA illustrated in FIG. 6 may be the same or substantially the same as the unit area UA and the pixel area PXA described above with reference to FIG. 1 and FIG. 2, and thus, redundant description thereof may not be repeated.

Referring to FIG. 6, first to fourth sub-pixel areas SA1c, SA2c, SA3c, and SA4c according to the third embodiment may be the same or substantially the same as the first to fourth sub-pixel areas SA1a, SA2a, SA3a, and SA4a described above with reference to FIG. 3 and FIG. 4, except for a planar shape thereof. In addition, first to fourth areas A1c, A2c, A3c, and A4c according to the third embodiment may be the same or substantially the same as the first to fourth areas A1a, A2a, A3a, and A4a described above with reference to FIG. 3 and FIG. 4, except for a planar shape thereof. Accordingly, redundant description thereof may not be repeated, and the differences therebetween may be mainly described hereinafter.

The first sub-pixel area SA1c may have a quadrangular shape. In this case, a border of the first sub-pixel area SA1c may include the first inner side I1, a portion of the third inner side I3 adjacent to the first inner side I1, and a portion of the fifth inner side I5 adjacent to the first inner side I1.

When the first sub-pixel area SA1c has the quadrangular shape, the first area A1c may have a quadrangular shape. In this case, a border of the first area A1c may surround (e.g., around a periphery of) the border of the first sub-pixel area SA1c.

The second sub-pixel area SA2c may have a pentagonal shape. In this case, a border of the second sub-pixel area SA2c may include a portion of the third inner side I3 adjacent to the fourth inner side I4, and a portion of the fourth inner side I4 adjacent to the third inner side I3.

When the second sub-pixel area SA2c has the pentagonal shape, the second area A2c may have a pentagonal shape. In this case, a border of the second area A2c may surround (e.g., around a periphery of) the border of the second sub-pixel area SA2c.

The third sub-pixel area SA3c may have a pentagonal shape. In this case, a border of the third sub-pixel area SA3c may include a portion of the fifth inner side I5 adjacent to the sixth inner side I6 and a portion of the sixth inner side I6 adjacent to the fifth inner side I5.

When the third sub-pixel area SA3c has the pentagonal shape, the third area A3c may have a pentagonal shape. In this case, a border of the third area A3c may surround (e.g., around a periphery of) the third sub-pixel area SA3c.

The fourth sub-pixel area SA4c may have a quadrangular shape. In this case, a border of the fourth sub-pixel area SA4c may include the second inner side I2, a portion of the fourth inner side I4 adjacent to the second inner side I2, and a portion of the sixth inner side I6 adjacent to the second inner side I2.

In an embodiment, the border of the fourth sub-pixel area SA4c and the border of the first sub-pixel area SA1c may be line-symmetric with each other with respect to the first reference line RL1 described above with reference to FIG. 2. In addition, each of the border of the fourth sub-pixel area SA4c and the border of the first sub-pixel area SA1c may be line-symmetric with each other with respect to the second reference line RL2 described above with reference to FIG. 2.

When the fourth sub-pixel area SA4c has the quadrangular shape, the fourth area A4c may have a quadrangular shape. In this case, a border of the fourth area A4c may surround (e.g., around a periphery of) the border of the fourth sub-pixel area SA4c.

Each of the first to fourth sub-pixel areas SA1c, SA2c, SA3c, and SA4c may have various suitable areas.

In an embodiment, an area of the first sub-pixel area SA1c may be the same or substantially the same as an area of the fourth sub-pixel area SA4c.

In an embodiment, an area of the second sub-pixel area SA2c may be different from an area of the third sub-pixel area SA3c. For example, the area of the third sub-pixel area SA3c may be larger than the area of the second sub-pixel area SA2c. As another example, the area of the third sub-pixel area SA3c may be smaller than the area of the second sub-pixel area SA2c.

In an embodiment, the area of the first sub-pixel area SA1c may be smaller than the area of the second sub-pixel area SA2c, and may be smaller than the area of the third sub-pixel area SA3c. In addition, the area of the fourth sub-pixel area SA4c may be smaller than the area of the second sub-pixel area SA2c, and may be smaller than the area of the third sub-pixel area SA3c.

Figure 7:
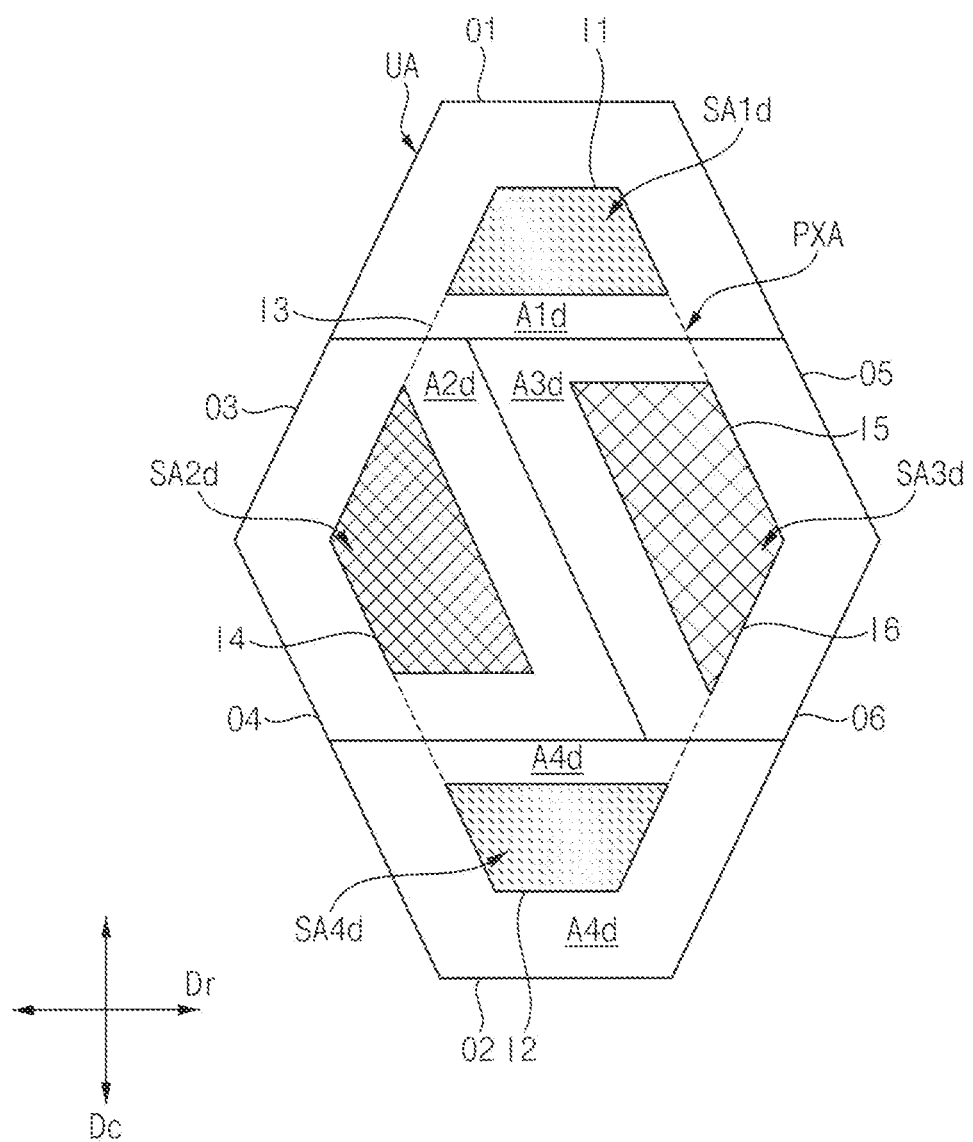
FIG. 7 is a plan view illustrating a sub-pixel area according to a fourth embodiment.

FIG. 7 is a plan view illustrating a sub-pixel area according to a fourth embodiment.

The unit area UA and the pixel area PXA illustrated in FIG. 7 may be the same or substantially the same as the unit area UA and the pixel area PXA described above with reference to FIG. 1 and FIG. 2, and thus, redundant description thereof may not be repeated.

Referring to FIG. 7, first to fourth sub-pixel areas SA1d, SA2d, SA3d, and SA4d according to the fourth embodiment may be the same or substantially same as the first to fourth sub-pixel areas SA1a, SA2a, SA3a, and SA4a described above with reference to FIG. 3 and FIG. 4, except for a planar shape thereof. In addition, first to fourth areas A1d, A2d, A3d, and A4d according to the fourth embodiment may be the same or substantially the same as the first to fourth areas A1a, A2a, A3a, and A4a described above with reference to FIG. 3 and FIG. 4, except for a planar shape thereof. Accordingly, redundant description thereof may not be repeated, and the differences therebetween may be mainly described hereinafter.

The first sub-pixel area SA1d may have a quadrangular shape. In this case, a border of the first sub-pixel area SA1d may include the first inner side I1, a portion of the third inner side I3 adjacent to the first inner side I1, and a portion of the fifth inner side I5 adjacent to the first inner side I1.

When the first sub-pixel area SA1d has the quadrangular shape, the first area A1d may have a quadrangular shape. In this case, a border of the first area A1d may surround (e.g., around a periphery of) the border of the first sub-pixel area SA1d.

The second sub-pixel area SA2d may have a quadrangular shape. In this case, a border of the second sub-pixel area SA2d may include a portion of the third inner side I3 adjacent to the fourth inner side I4, and a portion of the fourth inner side I4 adjacent to the third inner side I3.

When the second sub-pixel area SA2d has the quadrangular shape, the second area A2d may have a pentagonal shape. In this case, a border of the second area A2c may surround (e.g., around a periphery of) the border of the second sub-pixel area SA2c.

The third sub-pixel area SA3d may have a quadrangular shape. In this case, a border of the third sub-pixel area SA3d may include a portion of the fifth inner side I5 adjacent to the sixth inner side I6, and a portion of the sixth inner side I6 adjacent to the fifth inner side I5.

When the third sub-pixel area SA3d has the quadrangular shape, the third area A3d may have a pentagonal shape. In this case, a border of the third area A3d may surround (e.g., around a periphery of) the third sub-pixel area SA3d.

The fourth sub-pixel area SA4d may have a quadrangular shape. In this case, a border of the fourth sub-pixel area SA4d may include the second inner side I2, a portion of the fourth inner side I4 adjacent to the second inner side I2, and a portion of the sixth inner side I6 adjacent to the second inner side I2.

In an embodiment, the border of the fourth sub-pixel area SA4d and the border of the first sub-pixel area SA1d may be line-symmetric with each other with respect to the first reference line RL1 described above with reference to FIG. 2. In addition, each of the border of the fourth sub-pixel area SA4d and the border of the first sub-pixel area SA1d may be line-symmetric with each other with respect to the second reference line RL2 described above with reference to FIG. 2.

When the fourth sub-pixel area SA4d has the quadrangular shape, the fourth area A4d may have a quadrangular shape. In this case, a border of the fourth area A4d may surround (e.g., around a periphery of) the border of the fourth sub-pixel area SA4d.

Each of the first to fourth sub-pixel areas SA1d, SA2d, SA3d, and SA4d may have various suitable areas.

In an embodiment, an area of the first sub-pixel area SA1d may be the same or substantially the same as an area of the fourth sub-pixel area SA4d.

In an embodiment, an area of the second sub-pixel area SA2d may be different from an area of the third sub-pixel area SA3d. For example, the area of the third sub-pixel area SA3d may be larger than the area of the second sub-pixel area SA2d. As another example, the area of the third sub-pixel area SA3d may be smaller than the area of the second sub-pixel area SA2d.

In an embodiment, the area of the first sub-pixel area SA1d may be smaller than the area of the second sub-pixel area SA2d, and may be smaller than the area of the third sub-pixel area SA3d. In addition, the area of the fourth sub-pixel area SA4d may be smaller than the area of the second sub-pixel area SA2d, and may be smaller than the area of the third sub-pixel area SA3d.

Figure 8:
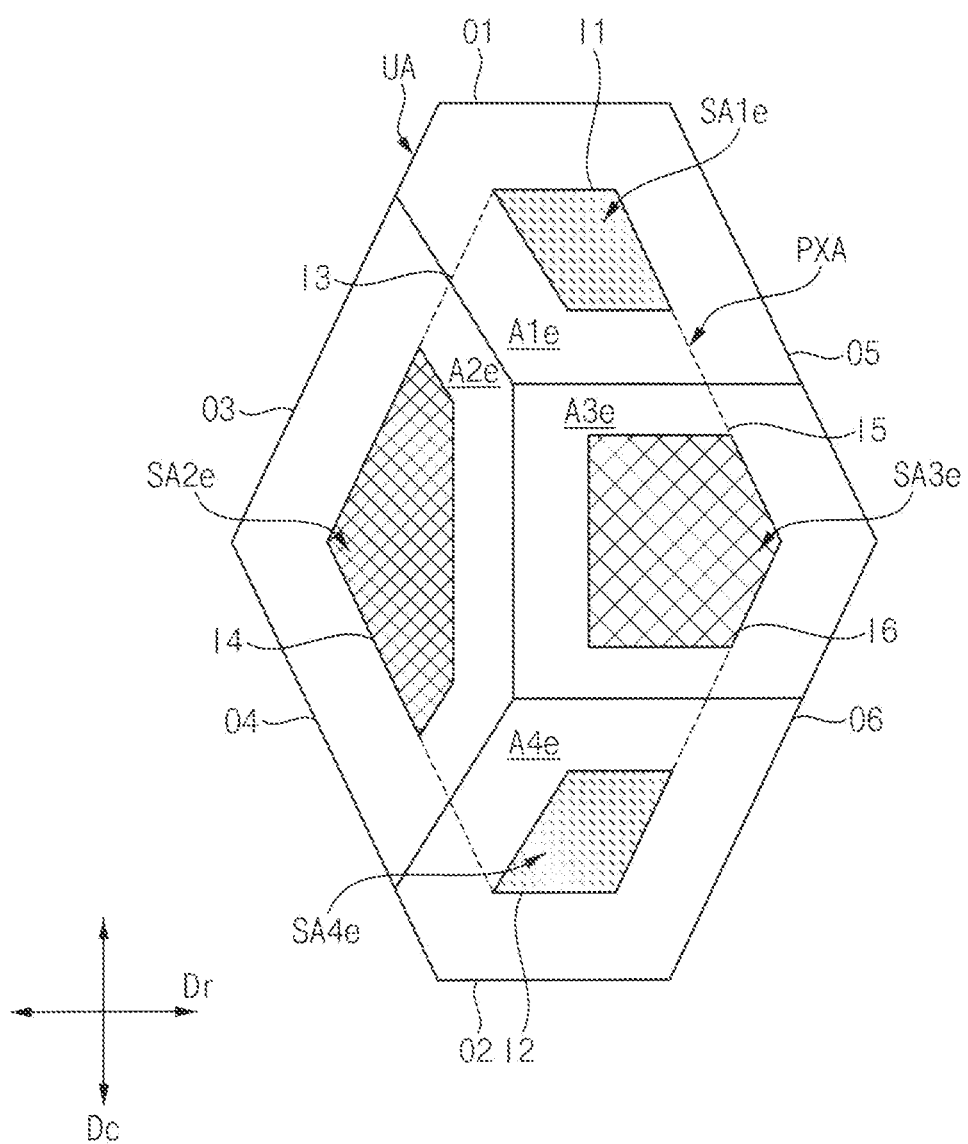
FIG. 8 is a plan view illustrating a sub-pixel area according to a fifth embodiment.

FIG. 8 is a plan view illustrating a sub-pixel area according to a fifth embodiment.

The unit area UA and the pixel area PXA illustrated in FIG. 8 may be the same or substantially the same as the unit area UA and the pixel area PXA described above with reference to FIG. 1 and FIG. 2, and thus, redundant description thereof may not be repeated.

Referring to FIG. 8, first to fourth sub-pixel areas SA1e, SA2e, SA3e, and SA4e according to the fifth embodiment may be the same or substantially the same as the first to fourth sub-pixel areas SA1a, SA2a, SA3a, and SA4a described above with reference to FIG. 3 and FIG. 4, except for a planar shape thereof. In addition, first to fourth areas A1e, A2e, A3e, and A4e according to the fifth embodiment may be the same or substantially same as the first to fourth areas A1a, A2a, A3a, and A4a described above with reference to FIG. 3 and FIG. 4, except for a planar shape thereof. Accordingly, redundant description thereof may not be repeated, and the differences therebetween may be mainly described hereinafter.

The first sub-pixel area SA1e may have a quadrangular shape. In this case, a border of the first sub-pixel area SA1e may include the first inner side I1, and a portion of the fifth inner side I5 adjacent to the first inner side I1.

When the first sub-pixel area SA1e has the quadrangular shape, the first area A1e may have a pentagonal shape. In this case, a border of the first area A1e may surround (e.g., around a periphery of) the border of the first sub-pixel area SA1e.

The second sub-pixel area SA2e may have a pentagonal shape. In this case, a border of the second sub-pixel area SA2e may include a portion of the third inner side I3 adjacent to the fourth inner side I4, and a portion of the fourth inner side I4 adjacent to the third inner side I3.

When the second sub-pixel area SA2e has the pentagonal shape, the second area A2e may have a pentagonal shape. In this case, a border of the second area A2e may surround (e.g., around a periphery of) the border of the second sub-pixel area SA2e.

The third sub-pixel area SA3e may have a pentagonal shape. In this case, a border of the third sub-pixel area SA3e may include a portion of the fifth inner side I5 adjacent to the sixth inner side I6, and a portion of the sixth inner side I6 adjacent to the fifth inner side I5.

When the third sub-pixel area SA3e has the pentagonal shape, the third area A3e may have a pentagonal shape. In this case, a border of the third area A3e may surround (e.g., around a periphery of) the third sub-pixel area SA3e.

The fourth sub-pixel area SA4e may have a quadrangular shape. In this case, a border of the fourth sub-pixel area SA4e may include the second inner side I2, and a portion of the sixth inner side I6 adjacent to the second inner side I2.

In an embodiment, the border of the fourth sub-pixel area SA4e and the border of the first sub-pixel area SA1e may be line-symmetric with each other with respect to the first reference line RL1 described above with reference to FIG. 2.

When the fourth sub-pixel area SA4d has the quadrangular shape, the fourth area A4d may have a pentagonal shape. In this case, a border of the fourth area A4e may surround (e.g., around a periphery of) the border of the fourth sub-pixel area SA4e.

Each of the first to fourth sub-pixel areas SA1e, SA2e, SA3e, and SA4e may have various suitable areas.

In an embodiment, an area of the first sub-pixel area SA1e may be the same or substantially the same as an area of the fourth sub-pixel area SA4e.

In an embodiment, an area of the second sub-pixel area SA2e may be different from an area of the third sub-pixel area SA3e. For example, the area of the third sub-pixel area SA3e may be larger than the area of the second sub-pixel area SA2e. As another example, the area of the third sub-pixel area SA3e may be smaller than the area of the second sub-pixel area SA2e.

In an embodiment, the area of the first sub-pixel area SA1e may be smaller than the area of the second sub-pixel area SA2e, and may be smaller than the area of the third sub-pixel area SA3e. In addition, the area of the fourth sub-pixel area SA4e may be smaller than the area of the second sub-pixel area SA2e, and may be smaller than the area of the third sub-pixel area SA3e.

Figure 9:
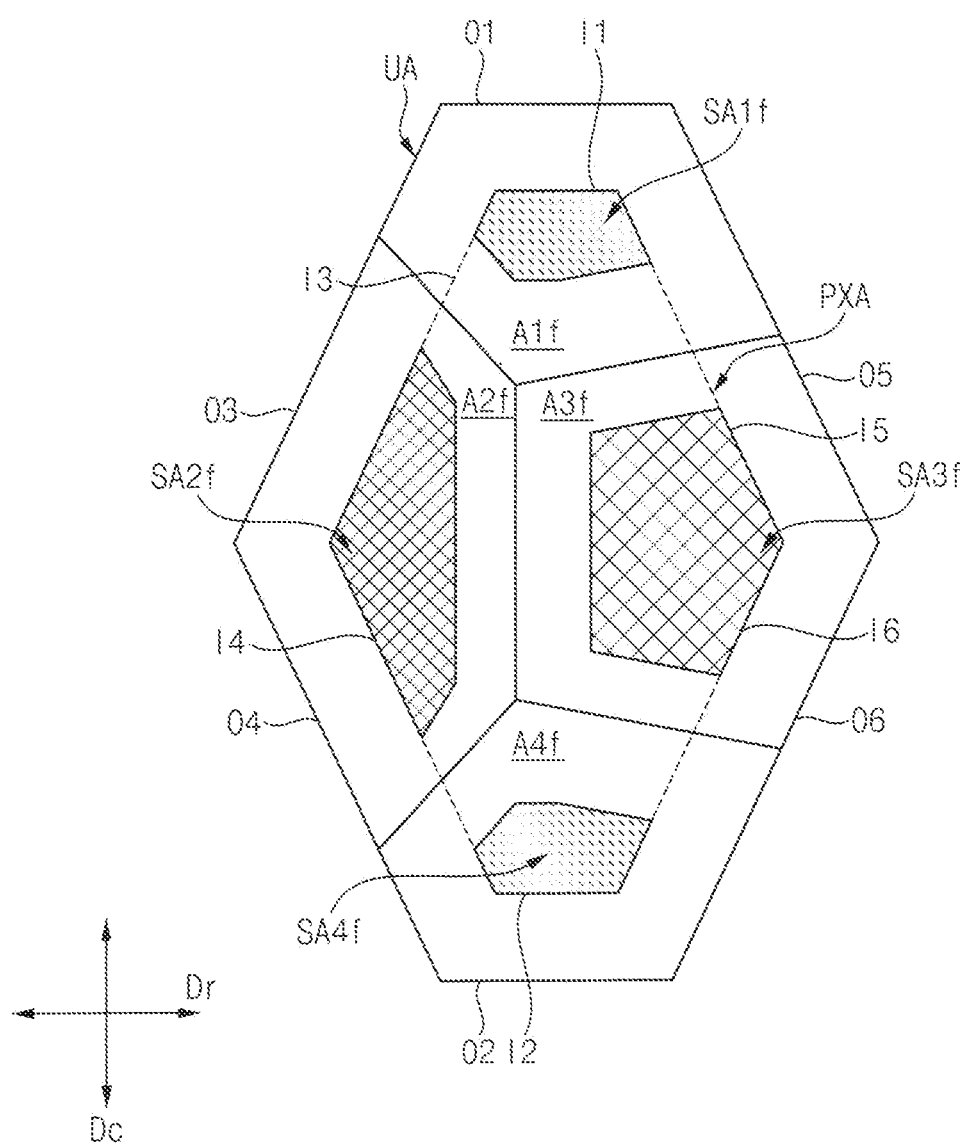
FIG. 9 is a plan view illustrating a sub-pixel area according to a sixth embodiment.

FIG. 9 is a plan view illustrating a sub-pixel area according to a sixth embodiment.

The unit area UA and the pixel area PXA illustrated in FIG. 9 may be the same or substantially the same as the unit area UA and the pixel area PXA described above with reference to FIG. 1 and FIG. 2, and thus, redundant description thereof may not be repeated.

Referring to FIG. 9, first to fourth sub-pixel areas Skit SA2f, SA3f, and SA4f according to the sixth embodiment may be the same or substantially the same as the first to fourth sub-pixel areas SA1a, SA2a, SA3a, and SA4a described above with reference to FIG. 3 and FIG. 4, except for a planar shape thereof. In addition, first to fourth areas A1f, A2f, A3f, and A4f according to the sixth embodiment may be the same or substantially the same as the first to fourth areas A1a, A2a, A3a, and A4a described above with reference to FIG. 3 and FIG. 4, except for a planar shape thereof. Accordingly, redundant description thereof may not be repeated, and the differences therebetween may be mainly described hereinafter.

The first sub-pixel area SA1f may have a hexagonal shape. In this case, a border of the first sub-pixel area SA1f may include the first inner side I1, a portion of the third inner side I3 adjacent to the first inner side I1, and a portion of the fifth inner side I5 adjacent to the first inner side I1.

When the first sub-pixel area SA1f has the hexagonal shape, the first area A1f may have a pentagonal shape. In this case, a border of the first area A1f may surround (e.g., around a periphery of) the border of the first sub-pixel area SA1f.

The second sub-pixel area SA2f may have a pentagonal shape. In this case, a border of the second sub-pixel area SA2f may include a portion of the third inner side I3 adjacent to the fourth inner side I4, and a portion of the fourth inner side I4 adjacent to the third inner side I3.

When the second sub-pixel area SA2f has the pentagonal shape, the second area A2f may have a pentagonal shape. In this case, a border of the second area A2f may surround (e.g., around a periphery of) the border of the second sub-pixel area SA2f.

The third sub-pixel area SA3f may have a pentagonal shape. In this case, a border of the third sub-pixel area SA3f may include a portion of the fifth inner side I5 adjacent to the sixth inner side I6, and a portion of the sixth inner side I6 adjacent to the fifth inner side I5.

When the third sub-pixel area SA3f has the pentagonal shape, the third area A3f may have a pentagonal shape. In this case, a border of the third area A3f may surround (e.g., around a periphery of) the third sub-pixel area SA3f.

The fourth sub-pixel area SA4f may have a hexagonal shape. In this case, a border of the fourth sub-pixel area SA4f may include the second inner side I2, a portion of the fourth inner side I4 adjacent to the second inner side I2, and a portion of the sixth inner side I6 adjacent to the second inner side I2.

In an embodiment, the border of the fourth sub-pixel area SA4f and the border of the first sub-pixel area SA1f may be line-symmetric with each other with respect to the first reference line RL1 described above with reference to FIG. 2.

When the fourth sub-pixel area SA4f has the hexagonal shape, the fourth area A4f may have a pentagonal shape. In this case, a border of the fourth area A4f may surround (e.g., around a periphery of) the border of the fourth sub-pixel area SA4f.

Each of the first to fourth sub-pixel areas Skit SA2f, SA3f, and SA4f may have various suitable areas.

In an embodiment, an area of the first sub-pixel area SA1f may be the same or substantially the same as an area of the fourth sub-pixel area SA4f.

In an embodiment, an area of the second sub-pixel area SA2f may be different from an area of the third sub-pixel area SA3f. For example, the area of the third sub-pixel area SA3f may be larger than the area of the second sub-pixel area SA2f. As another example, the area of the third sub-pixel area SA3f may be smaller than the area of the second sub-pixel area SA2f.

In an embodiment, the area of the first sub-pixel area SA1f may be smaller than the area of the second sub-pixel area SA2f, and may be smaller than the area of the third sub-pixel area SA3f. In addition, the area of the fourth sub-pixel area SA4f may be smaller than the area of the second sub-pixel area SA2f, and may be smaller than the area of the third sub-pixel area SA3f.

Figure 10:
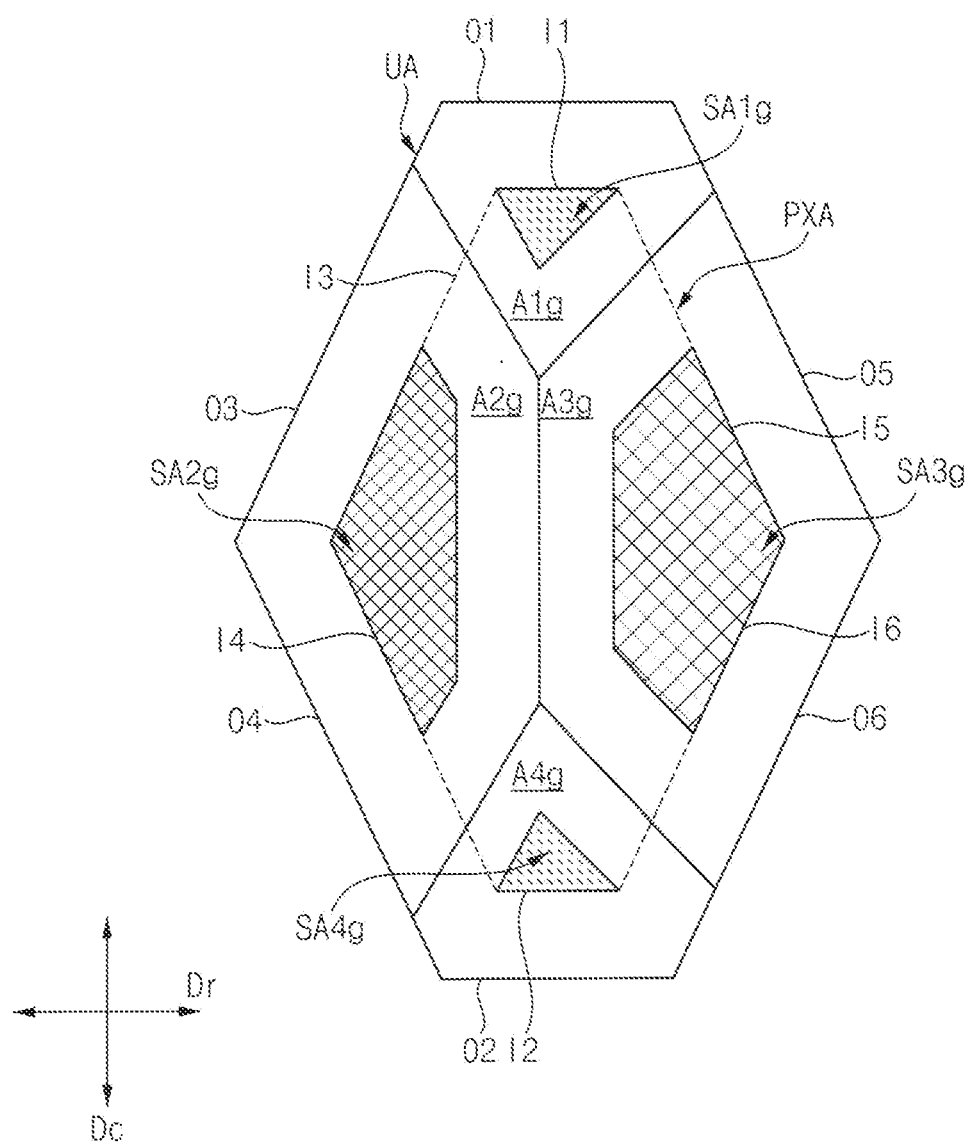
FIG. 10 is a plan view illustrating a sub-pixel area according to a seventh embodiment.

FIG. 10 is a plan view illustrating a sub-pixel area according to a seventh embodiment.

The unit area UA and the pixel area PXA illustrated in FIG. 10 may be the same or substantially the same as the unit area UA and the pixel area PXA described above with reference to FIG. 1 and FIG. 2, and thus, redundant description thereof may not be repeated.

Referring to FIG. 10, first to fourth sub-pixel areas SA1g, SA2g, SA3g, and SA4g according to the seventh embodiment may be the same or substantially the same as the first to fourth sub-pixel areas SA1a, SA2a, SA3a, and SA4a described above with reference to FIG. 3 and FIG. 4, except for a planar shape thereof. In addition, first to fourth areas A1g, A2g, A3g, and A4g according to the seventh embodiment may be the same or substantially the same as the first to fourth areas A1a, A2a, A3a, and A4a described above with reference to FIG. 3 and FIG. 4, except for a planar shape thereof. Accordingly, redundant description thereof may not be repeated, and the differences therebetween may be mainly described hereinafter.

The first sub-pixel area SA1g may have a triangle shape. In this case, a border of the first sub-pixel area SA1g may include the first inner side I1.

When the first sub-pixel area SA1g has the triangle shape, the first area A1g may have a pentagonal shape. In this case, a border of the first area A1g may surround (e.g., around a periphery of) the border of the first sub-pixel area SA1g.

The second sub-pixel area SA2g may have a pentagonal shape. In this case, a border of the second sub-pixel area SA2g may include a portion of the third inner side I3 adjacent to the fourth inner side I4, and a portion of the fourth inner side I4 adjacent to the third inner side I3.

When the second sub-pixel area SA2g has the pentagonal shape, the second area A2g may have a pentagonal shape. In this case, a border of the second area A2g may surround (e.g., around a periphery of) the border of the second sub-pixel area SA2g.

The third sub-pixel area SA3g may have a pentagonal shape. In this case, a border of the third sub-pixel area SA3g may include a portion of the fifth inner side I5 adjacent to the sixth inner side I6, and a portion of the sixth inner side I6 adjacent to the fifth inner side I5.

When the third sub-pixel area SA3g has the pentagonal shape, the third area A3g may have a pentagonal shape. In this case, a border of the third area A3g may surround (e.g., around a periphery of) the third sub-pixel area SA3g.

The fourth sub-pixel area SA4g may have a triangle shape. In this case, a border of the fourth sub-pixel area SA4g may include the second inner side I2.

In an embodiment, the border of the fourth sub-pixel area SA4g and the border of the first sub-pixel area SA1g may be line-symmetric with each other with respect to the first reference line RL1 described above with reference to FIG. 2.

When the fourth sub-pixel area SA4g has the triangle shape, the fourth area A4g may have a pentagonal shape. In this case, a border of the fourth area A4g may surround (e.g., around a periphery of) the border of the fourth sub-pixel area SA4g.

Each of the first to fourth sub-pixel areas SA1g, SA2g, SA3g, and SA4g may have various suitable areas.

In an embodiment, an area of the first sub-pixel area SA1g may be the same or substantially the same as an area of the fourth sub-pixel area SA4g.

In an embodiment, an area of the second sub-pixel area SA2g may be different from an area of the third sub-pixel area SA3g. For example, the area of the third sub-pixel area SA3g may be larger than the area of the second sub-pixel area SA2g. As another example, the area of the third sub-pixel area SA3g may be smaller than the area of the second sub-pixel area SA2g.

In an embodiment, the area of the first sub-pixel area SA1g may be smaller than the area of the second sub-pixel area SA2g, and may be smaller than the area of the third sub-pixel area SA3g. In addition, the area of the fourth sub-pixel area SA4g may be smaller than the area of the second sub-pixel area SA2g, and may be smaller than the area of the third sub-pixel area SA3g.

Figure 11:
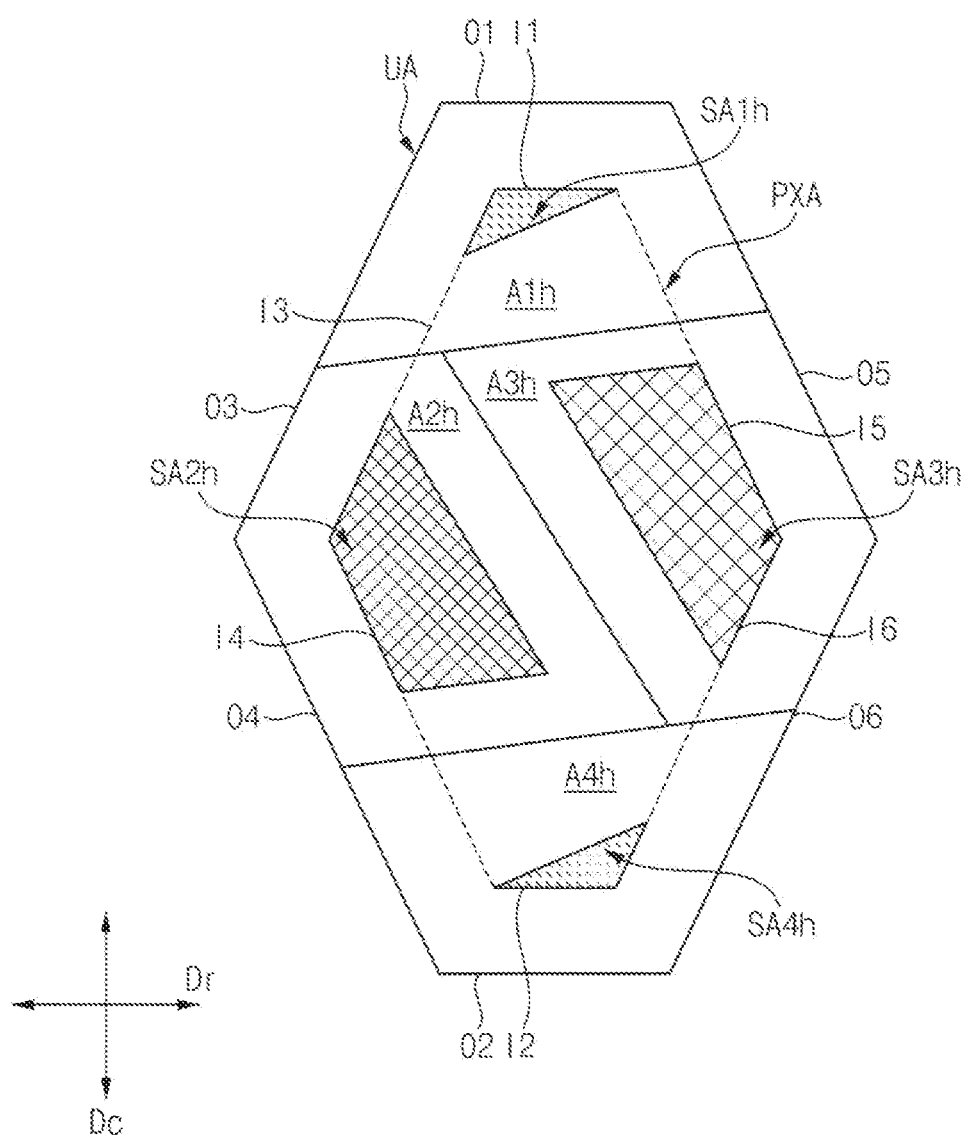
FIG. 11 is a plan view illustrating a sub-pixel area according to an eight embodiment.

FIG. 11 is a plan view illustrating a sub-pixel area according to an eight embodiment.

The unit area UA and the pixel area PXA illustrated in FIG. 11 may be the same or substantially the same as the unit area UA and the pixel area PXA described above with reference to FIG. 1 and FIG. 2, and thus, redundant description thereof may not be repeated.

Referring to FIG. 11, first to fourth sub-pixel areas SA1h, SA2h, SA3h, and SA4h according to the eight embodiment may be the same or substantially the same as the first to fourth sub-pixel areas SA1a, SA2a, SA3a, and SA4a described above with reference to FIG. 3 and FIG. 4, except for a planar shape thereof. In addition, first to fourth areas A1h, A2h, A3h, and A4h according to the eight embodiment may be the same or substantially the same as the first to fourth areas A1a, A2a, A3a, and A4a described above with reference to FIG. 3 and FIG. 4, except for a planar shape thereof. Accordingly, redundant description thereof may not be repeated, and the differences therebetween may be mainly described hereinafter.

The first sub-pixel area SA1h may have a triangle shape. In this case, a border of the first sub-pixel area SA1h may include the first inner side I1, and a portion of the third inner side I3 adjacent to the first inner side I1.

When the first sub-pixel area SA1h has the triangle shape, the first area A1h may have a quadrangular shape. In this case, a border of the first area A1h may surround (e.g., around a periphery of) the border of the first sub-pixel area SA1h.

The second sub-pixel area SA2h may have a quadrangular shape. In this case, a border of the second sub-pixel area SA2h may include a portion of the third inner side I3 adjacent to the fourth inner side I4, and a portion of the fourth inner side I4 adjacent to the third inner side I3.

When the second sub-pixel area SA2h has the quadrangular shape, the second area A2h may have a pentagonal shape. In this case, a border of the second area A2h may surround (e.g., around a periphery of) the border of the second sub-pixel area SA2h.

The third sub-pixel area SA3h may have a quadrangular shape. In this case, a border of the third sub-pixel area SA3h may include a portion of the fifth inner side I5 adjacent to the sixth inner side I6, and a portion of the sixth inner side I6 adjacent to the fifth inner side I5.

When the third sub-pixel area SA3h has the quadrangular shape, the third area A3h may have a pentagonal shape. In this case, a border of the third area A3h may surround (e.g., around a periphery of) the third sub-pixel area SA3h.

The fourth sub-pixel area SA4h may have a triangle shape. In this case, a border of the fourth sub-pixel area SA4h may include the second inner side I2, and a portion of the sixth inner side I6 adjacent to the second inner side I2.

In an embodiment, the border of the fourth sub-pixel area SA4h and the border of the first sub-pixel area SA1h may be point-symmetric with each other with respect to the reference point RP described above with reference to FIG. 2.

When the fourth sub-pixel area SA4h has the triangle shape, the fourth area A4h may have a quadrangular shape. In this case, a border of the fourth area A4h may surround (e.g., around a periphery of) the border of the fourth sub-pixel area SA4h.

Each of the first to fourth sub-pixel areas SA1h, SA2h, SA3h, and SA4h may have various suitable areas.

In an embodiment, an area of the first sub-pixel area SA1h may be the same or substantially the same as an area of the fourth sub-pixel area SA4h.

In an embodiment, an area of the second sub-pixel area SA2h may be different from an area of the third sub-pixel area SA3h. For example, the area of the third sub-pixel area SA3h may be larger than the area of the second sub-pixel area SA2h. As another example, the area of the third sub-pixel area SA3h may be smaller than the area of the second sub-pixel area SA2h.

In an embodiment, the area of the first sub-pixel area SA1h may be smaller than the area of the second sub-pixel area SA2h, and may be smaller than the area of the third sub-pixel area SA3h. In addition, the area of the fourth sub-pixel area SA4h may be smaller than the area of the second sub-pixel area SA2h, and may be smaller than the area of the third sub-pixel area SA3h.

Figure 12:
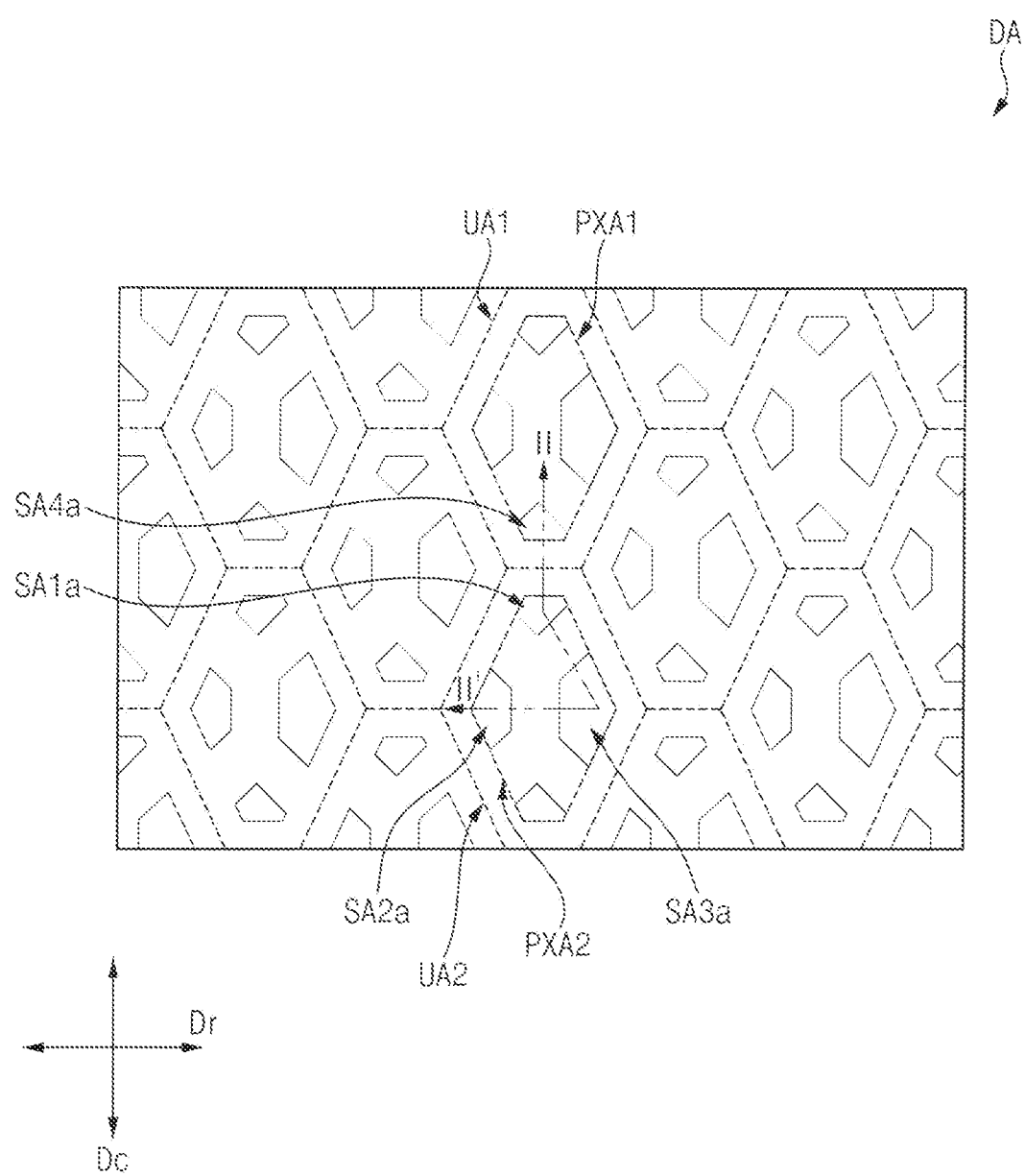

FIG. 12 through FIG. 19 are diagrams illustrating a method of manufacturing the display device of FIG. 1. For convenience of illustration, a portion of the display area DA is illustrated in FIG. 12, and redundant description as those of the embodiments described above with reference to FIG. 1, FIG. 2, FIG. 3, and FIG. 4 may not be repeated.

Figure 13:
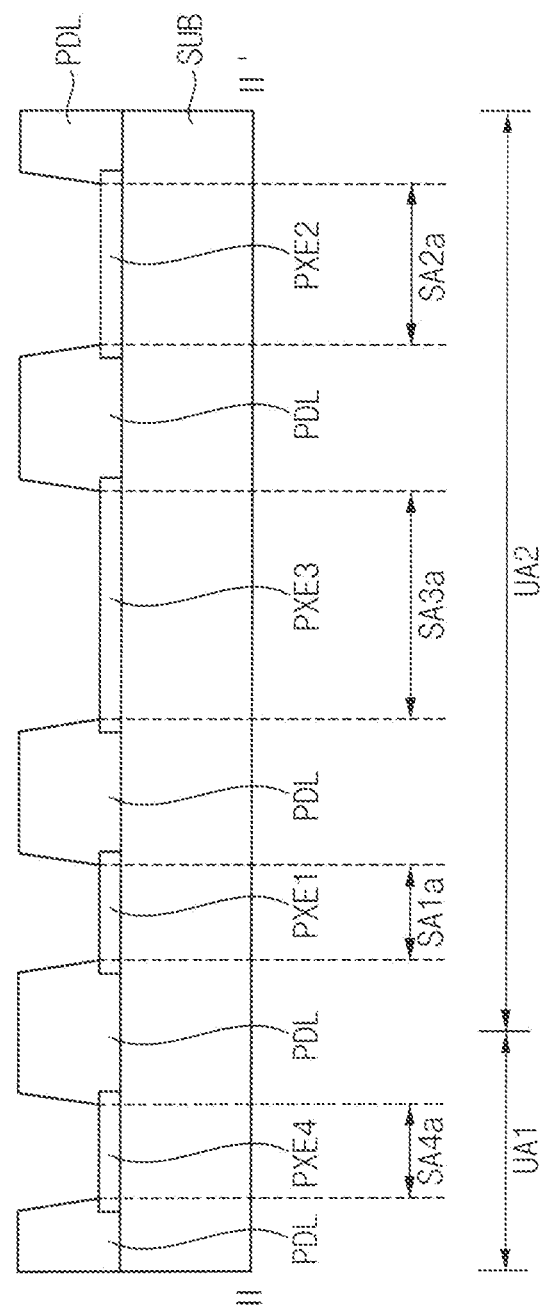

Referring to FIG. 12 and FIG. 13, after forming the pixel electrodes PXE1, PXE2, PXE3, and PXE4, the pixel defining layer PDL may be formed. The pixel defining layer PDL may define the opening exposing each of the pixel electrodes PXE1, PXE2, PXE3, and PXE4.

The pixel defining layer PDL may include a plurality of unit areas UA, and a pixel area disposed in each of the plurality of unit areas UA. The plurality of unit areas UA may include a first unit area UA1, and a second unit area UA2 adjacent to the first unit area UA1 in the column direction Dc. The second outer side O2 of the first unit area UA1 may be in contact with the first outer side O1 of the second unit area UA2.

A first pixel area PXA1 may be disposed in the first unit area UA1, and a second pixel area PXA2 may be disposed in the second unit area UA2.

The opening may include the first pixel opening exposing the first pixel electrode PXE1, the second pixel opening exposing the second pixel electrode PXE2, the third pixel opening exposing the third pixel electrode PXE3, and the fourth pixel opening exposing the fourth pixel electrode PXE4. The first pixel opening may correspond to the first sub-pixel area SA1a, the second pixel opening may correspond to the second sub-pixel area SA2a, the third pixel opening may correspond to the third sub-pixel area SA3a, and the fourth pixel opening may correspond to the fourth sub-pixel area SA4a.

Figure 15:
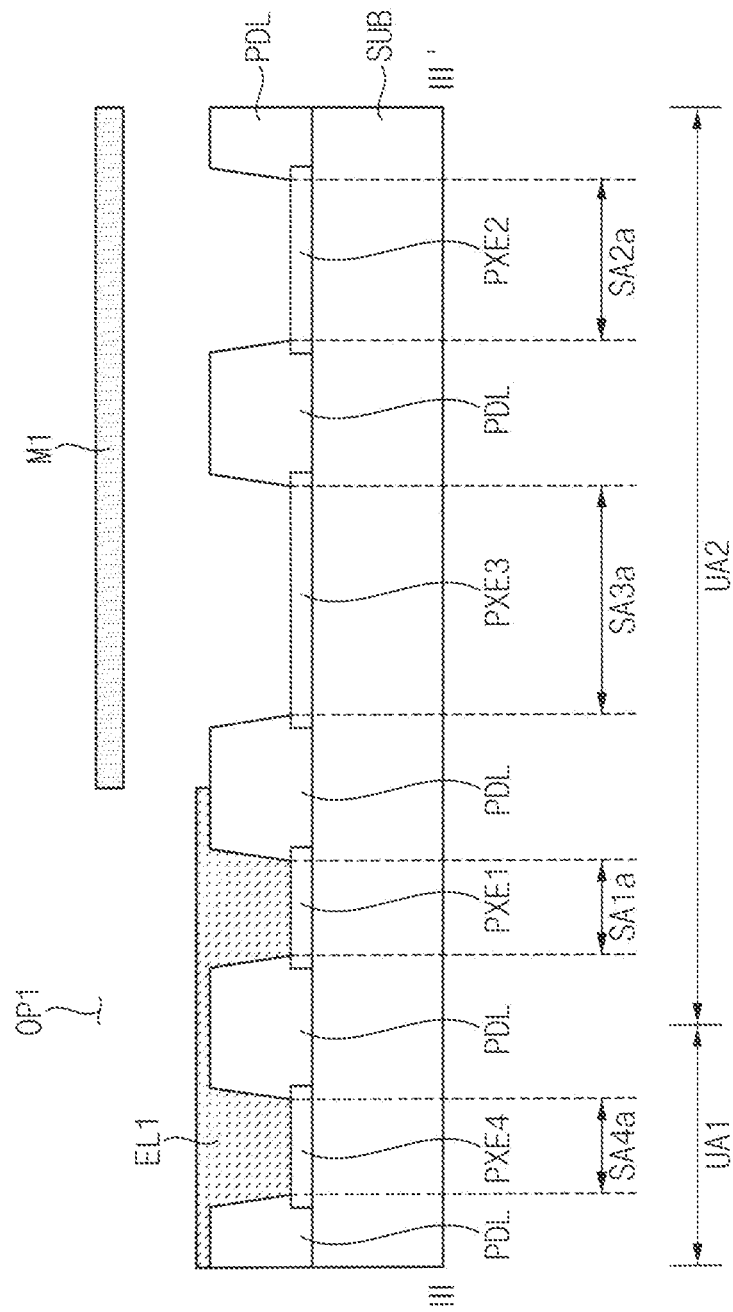

Referring to FIG. 14 and FIG. 15, the first light emitting material EU may be deposited in the first pixel opening and the fourth pixel opening. In this case, the first light emitting material EL1 may be concurrently (e.g., simultaneously) deposited in the first pixel opening disposed in the second unit area UA2 and the fourth pixel opening disposed in the first unit area UA1.

In more detail, a first mask M1 may be disposed on the pixel defining layer PDL. The first mask M1 may define a first opening pattern OP1. The first opening may expose the first and fourth sub-pixel areas SA1a and SA4a disposed in each of the plurality of unit areas UA. In this case, the first opening pattern OP1 may concurrently (e.g., simultaneously) expose the fourth sub-pixel area SA4a disposed in one of two unit areas UA that are adjacent to each other in the column direction Dc from among the plurality of unit areas UA and the first sub-pixel area SA1a disposed in the other of the two unit areas UA. For example, the first opening pattern OP1 may concurrently (e.g., simultaneously) expose the fourth sub-pixel area SA4a disposed in the first unit area UA1 and the first sub-pixel area SA1a disposed in the second unit area UA2.

After disposing the mask M1, the first light emitting material EL1 may be deposited on a portion exposed by the first opening pattern OP1. In an embodiment, a border of the first opening pattern OP1 concurrently (e.g., simultaneously) exposing the fourth sub-pixel area SA4a disposed in the first unit area UA1 and the first sub-pixel area SA1a disposed in the second unit area UA2 may be the same or substantially the same as an overall border of the fourth area A4a disposed in the first unit area UA1 and the first area A1a (e.g., refer to FIG. 4) disposed in the second unit area UA2.

Figure 17:
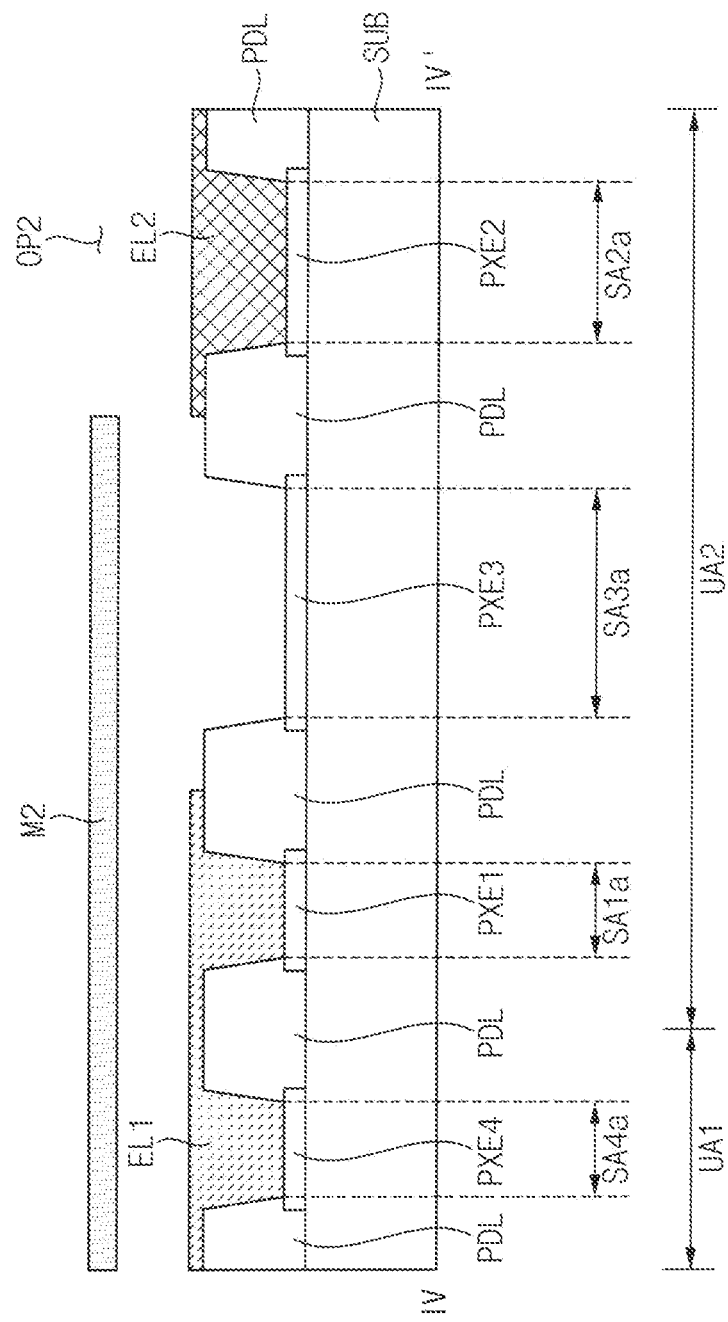

Referring to FIG. 16 and FIG. 17, the second light emitting material EL2 may be deposited in the second pixel opening.

In more detail, a second mask M2 may be disposed on the pixel defining layer PDL. The second mask M2 may define a second opening pattern OP2. The second opening pattern OP2 may expose the second sub-pixel area SA2a disposed in each of the plurality of unit areas UA.

After disposing the second mask M2, the second light emitting material EL2 may be deposited on a portion exposed by the second opening pattern OP2. In an embodiment, a border of the second opening pattern OP2 may be the same or substantially the same as the border of the second area A2a (e.g., refer to FIG. 4).

Figure 18:
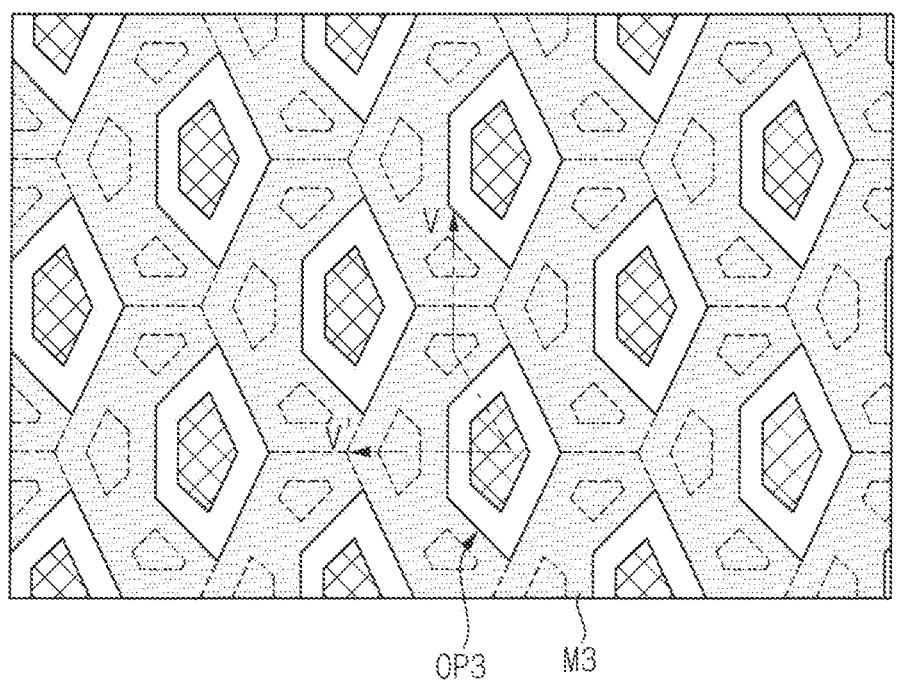
Figure 19:
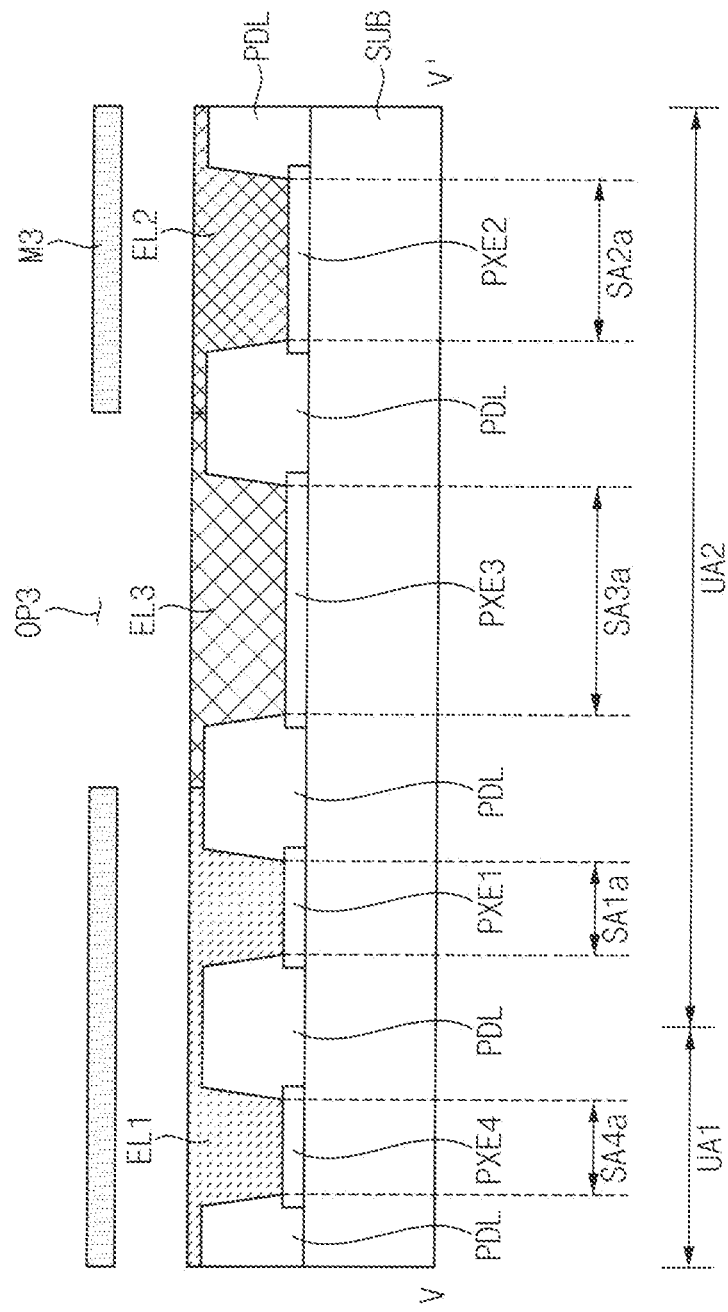

Referring to FIG. 18 and FIG. 19, the third light emitting material EL3 may be deposited in the third pixel opening.

In more detail, a third mask M3 may be disposed on the pixel defining layer PDL. The third mask M3 may define a third opening pattern OP3. The third opening pattern OP3 may expose the third sub-pixel area SA3a disposed in each of the plurality of unit areas UA.

After disposing the third mask M3, the third light emitting material EL3 may be deposited on a portion exposed by the third opening pattern OP3. In an embodiment, a border of the third opening pattern OP3 may be the same or substantially the same as the border of the third area A3a (e.g., refer to FIG. 4).

Referring to FIG. 14 through FIG. 19, an embodiment in which the first light emitting material is disposed, and after the first light emitting material E1 is disposed, the second light emitting material EL2 is disposed, and then the third light emitting material EL3 is finally disposed is described. However, the order of the deposition of the first to third light emitting materials EL1, EL2, and EL3 is not limited thereto. For example, after depositing the second light emitting material EL2, the third light emitting material EL3 may be deposited, and then the first light emitting material EL1 may be finally deposited. As another example, after the second light emitting material EL2 is deposited, the first light emitting material EL1 may be deposited, and then the third light emitting material EL3 may be finally deposited.

In an embodiment, an area of the first opening pattern OP1 may be greater than or equal to about 80%, and less than or equal to about 120%, of an area of the third opening pattern OP3, and an area of the second opening pattern OP2 may be greater than or equal to about 80%, and less than or equal to about 120%, of the area of the third opening pattern OP3. Accordingly, an opening ratio of each of the first to third opening patterns OP1, OP2, and OP3 may be sufficiently secured, and a manufacturing yield of the first to third masks M1, M2, and M3 may be sufficiently secured.

Referring to FIG. 2, FIG. 14, and FIG. 19, the border of the unit area UA may surround (e.g., around a periphery of) the border of the pixel area PXA, and the border of the unit area UA may be spaced apart from the border of the pixel area PXA. In this case, in the plurality of unit areas UA, the pixel area PXA disposed in one of two adjacent unit areas UA and the pixel area PXA disposed in the other of the two adjacent unit areas UA may be spaced apart from each other. Accordingly, when the first to third light emitting materials EL1, EL2, and EL3 are deposited, even if an alignment of the first to third masks M1, M2, and M3 is partially misaligned, the first to third light emitting materials EL1, EL2, and EL3 may be sufficiently deposited in the first to fourth pixel openings.

Figure 20:
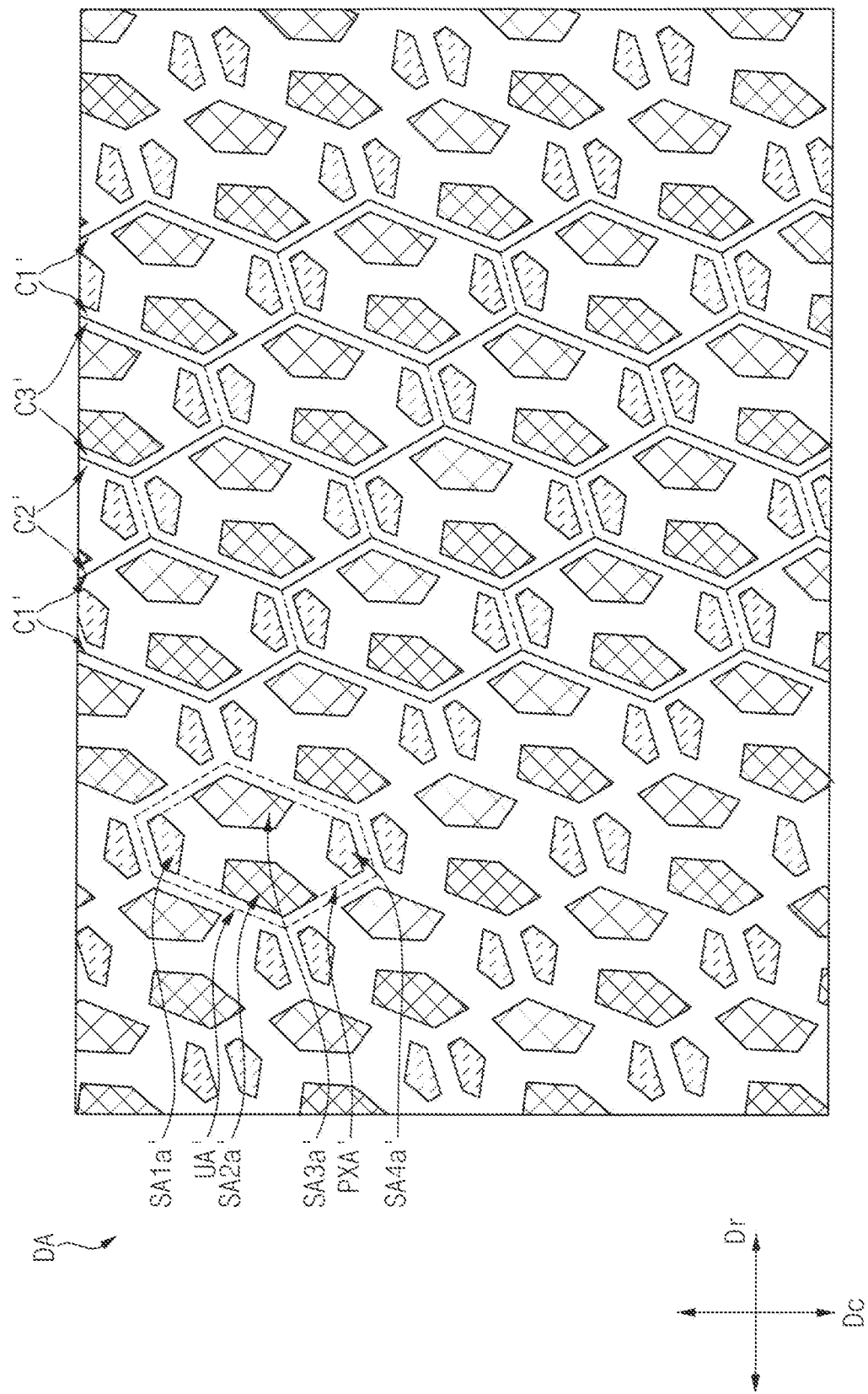
FIG. 20 is a plan view illustrating a display device according to another embodiment.
Figure 21:
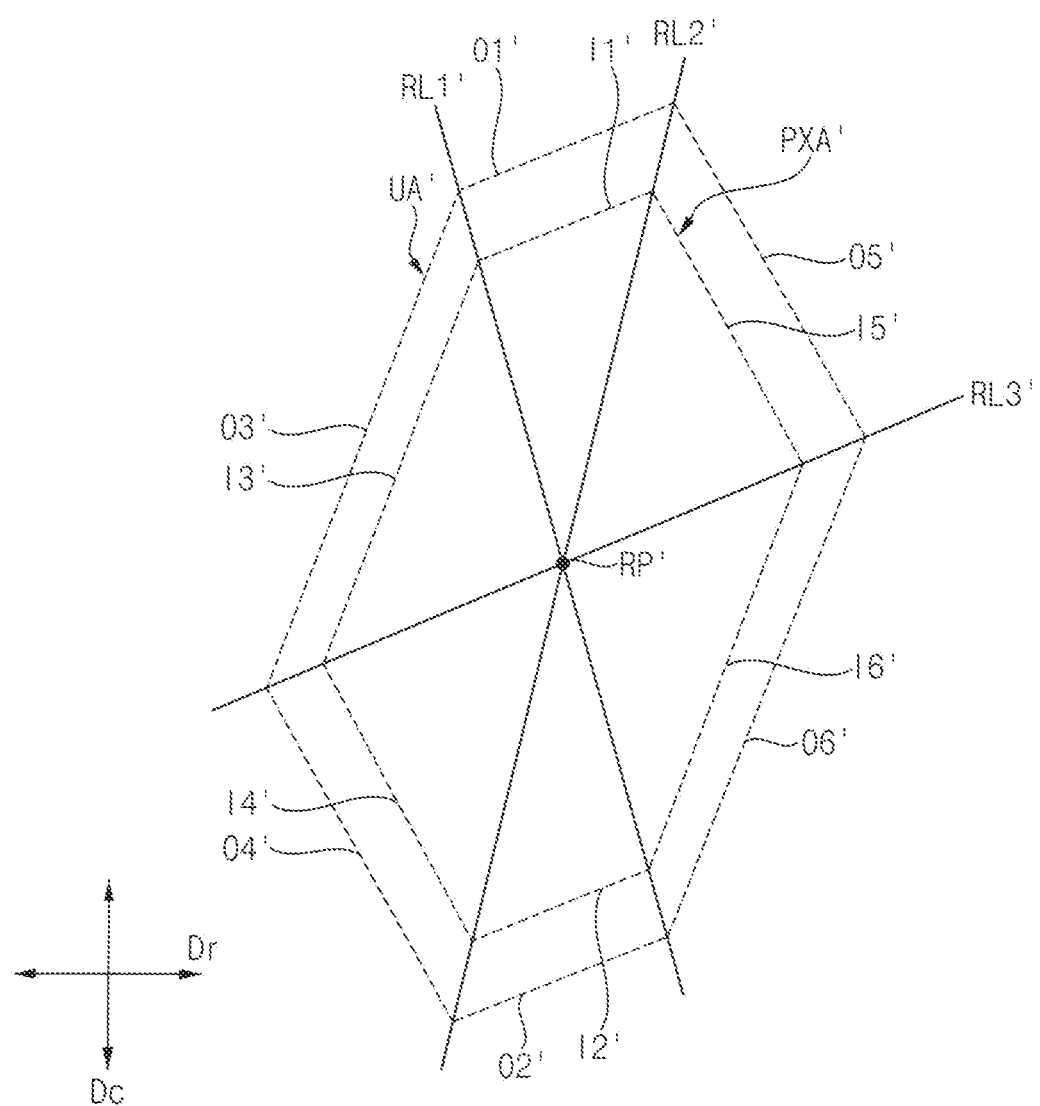
FIG. 21 is diagram illustrating a unit area and a pixel area included in the display device of FIG. 20.

FIG. 20 is a plan view illustrating a display device according to another embodiment. FIG. 21 is diagram illustrating a unit area and a pixel area included in the display device of FIG. 20.

Referring to FIG. 20 and FIG. 21, a display device may include a display area DA. The display area DA may be an area for displaying an image. In FIG. 20, a portion of the display area DA is illustrated for convenience of illustration.

The display area DA may be divided into a plurality of unit areas UA'. The plurality of unit areas UA' may be defined as a set of minimum units capable of filling the display area DA without blanking or overlapping with each other. Each of the plurality of unit areas UA' may have the same or substantially the same shape as each other. In more detail, in any one unit area UA' from among the plurality of unit areas UA', the unit area UA' may have a hexagonal shape in which each of all interior angles is less than 180 degrees.

Each of the plurality of unit areas UA' may have a first border defining a boundary of each of the plurality of unit areas UA'. The first border may be an imaginary line that is not recognized by a user of the display device.

In an embodiment, the first border may be point-symmetric with respect to a reference point RP' located within the unit area UA'. In this case, the phrase "the reference point RP' is located within the unit area UA'" may have the same or substantially the same meaning as the phrase "the reference point RP' is surrounded (e.g., around a periphery thereof) by the first border". In other words, first to third reference lines RL1', RL2', and RL3' that are different from each other may pass through the reference point RP' through all vertices of the first border, and each of the first to third reference lines RL1', RL2', and RL3' may bisect an area of the unit area UA'.

In an embodiment, the first border may have a hexagonal shape including a first outer side O1', a second outer side O2', a third outer side O3', a fourth outer side O4', a fifth outer side O5', and a sixth outer side O6'.

A length of the first outer side O1' may be the same or substantially the same as a length of the second outer side O2', and the first outer side O1' may be parallel to or substantially parallel to the second outer side O2'. In addition, the first outer side O1' may extend or substantially extend in (e.g., may be parallel to or substantially parallel to) the row direction Dr. Accordingly, the second outer side O2' of one unit area UA' from among two unit areas UA' that are adjacent to each other in the column direction Dc from among the plurality of unit areas UA' may contact the first outer side O1' of the other unit area UA' from among the two unit areas UA'.

The third outer side O3' and the fourth outer side O4' may connect one end of the first outer side O1' and one end of the second outer side O2' to each other. The fifth outer side O5' and the sixth outer side O6' may connect the other end of the first outer side O1' opposite to the one end of the first outer side O1' and other end of the second outer side O2' opposite to the one end of the second outer side O2' to each other.

A pixel area PXA' may be disposed in each of the plurality of unit areas UA'. The pixel area PXA' may have a hexagonal shape in which a size of each of all interior angles is less than 180 degrees.

The pixel area PXA' may have a second border defining a boundary of the pixel area PXA'. The second border may be an imaginary line that is not recognized by a user of the display device. Because the pixel area PXA' is disposed in each of the plurality of unit areas UA', the second border may be disposed inside (e.g., within) the first border. In this case, the second border may be spaced apart from the first border.

In an embodiment, the second border may be point-symmetric with respect to the reference point RP' located within the unit area UA' (e.g., or located within the pixel area PXA'). In other words, the first to third reference lines RL1', RL2', and RL3' that are different from each other and passing through the reference point RP' may pass through all vertices of the second border, and each of the first to third reference lines RL1', RL2', and RL3' may bisect an area of the pixel area PXA'.

In an embodiment, the second border may have a hexagonal shape including a first inner side I1' adjacent to the first outer side O1', a second inner side I2' adjacent to the second outer side O2', a third inner side I3' adjacent to the third outer side O3', a fourth inner side I4' adjacent to the fourth outer side O4', a fifth inner side I5' adjacent to the fifth outer side O5', and a sixth inner side I6' adjacent to the sixth outer side O6'.

The third inner side I3' and the fourth inner side I4' may connect one end of the first inner side I1' and one end of the second inner side I2' to each other. The fifth inner side I5' and the sixth inner side I6' may connect the other end of the first inner side I1' opposite to the one end of the first inner side I1' and the other end of the second inner side I2' opposite to the one end of the second inner side I2' to each other.

In an embodiment, the first inner side I1' may be parallel to or substantially parallel to the first outer side O1', the second inner side I2' may be parallel to or substantially parallel to the second outer side O2', the third inner side I3' may be parallel to or substantially parallel to the third outer side O3', the fourth inner side I4' may be parallel to or substantially parallel to the fourth outer side O4', the fifth inner side I5' may be parallel to or substantially parallel to the fifth outer side O5', and the sixth inner side I6' may be parallel to or substantially parallel to the sixth outer side O6'.

A first sub-pixel area SA1a', a second sub-pixel area SA2a', a third sub-pixel area SA3a', and a fourth sub-pixel area SA4a' may be disposed in the pixel area PXA'. Each of the first to fourth sub-pixel areas SA1a', SA2a', SA3a', and SA4a' may be a minimum unit for emitting or substantially emitting light.

A border of the first sub-pixel area SA1a' may include the first inner side I1'. A border of the fourth sub-pixel area SA4a' may include the second inner side I2'. Accordingly, in one or more embodiments of the present disclosure, the fourth sub-pixel area SA4a' disposed in one unit area UA' from among two unit areas UA' that are adjacent to each other in the column direction Dc from among the plurality of unit areas UA' may be adjacent to the first sub-pixel area SA1a' of the other unit area UA' from among the two unit areas UA'.

A border of the second sub-pixel area SA2a' may include a portion of the second border. For example, the second sub-pixel area SA2a' may include a portion of the third inner side I3' adjacent to the fourth inner side I4', and a portion of the fourth inner side I4' adjacent to the third inner side I3'.

A border of the third sub-pixel area SA3a' may include another portion of the second border. For example, the third sub-pixel area SA3a' may include a portion of the fifth inner side I5' adjacent to the sixth inner side I6', and a portion of the sixth inner side I6' adjacent to the fifth inner side I5'.

In FIG. 20, the first to fourth sub-pixel areas SA1a', SA2a', SA3a', and SA4a' having a pentagonal shape are illustrated, but the shape of the first to fourth sub-pixel areas SA1a', SA2a', SA3a', and SA4a' is not limited thereto. For example, as described above with reference to FIG. 5 through FIG. 11, the border of the first sub-pixel area SA1a' and the border of the fourth sub-pixel area SA4a' may have a N-polygon shape (where N is 3, 4, 5, or 6). As another example, as described above with reference to FIG. 5 through FIG. 11, the border of the second sub-pixel area SA2a' and the border of the third sub-pixel area SA3a' may have a M-polygon shape (where M is 4 or 5). In this case, in some embodiments, the border of the first sub-pixel area SA1a' and the border of the fourth sub-pixel area SA4a' may be point-symmetric with each other with respect to the reference point RP'.

Unit areas UA' arranged along the column direction Dc from among the plurality of unit areas UA' may define a plurality of pixel columns. For example, the plurality of pixel columns may include a first pixel column C1', a second pixel column C2' adjacent to the first pixel column C1' in the row direction Dr, and a third pixel column C3' adjacent to the second pixel column C2' in the row direction Dr. The second pixel column C2' may be a pixel column in which the first pixel column C1' is shifted by a suitable distance (e.g., a predetermined distance) in the column direction Dc, and the third pixel column C3' may be a pixel column in which the second pixel column C2' is shifted by a suitable distance (e.g., a predetermined distance) in the column direction Dc.

The plurality of pixel columns may be interlocked with one another, and arranged along the row direction Dr. For example, the first pixel column C1' and the second pixel column C2' may be interlocked with each other, the second pixel column C2' and the third pixel column C3' may be interlocked with each other, and the third pixel column C3' and the first pixel column C1' may be interlocked with each other. In other words, as shown in FIG. 20, the first to third pixel columns C1', C2', and C3' may be interlocked with one another, and alternately arranged along the row direction Dr.

Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A display device, comprising:
    a plurality of unit areas, each of the plurality of unit areas including a first border having a hexagonal shape comprising:
        a first outer side; and
        a second outer side parallel to the first outer side, and having a length equal to a length of the first outer side;
    a pixel area in each of the plurality of unit areas, and including a second border having a hexagonal shape comprising:
        a first inner side adjacent to the first outer side; and
        a second inner side adjacent to the second outer side;
    a first sub-pixel area in the pixel area, a border of the first sub-pixel area comprising the first inner side;
    a first light emitting material in the first sub-pixel area;
    a second sub-pixel area in the pixel area, a border of the second sub-pixel area comprising a first portion of the second border;
    a second light emitting material in the second sub-pixel area;
    a third sub-pixel area in the pixel area, a border of the third sub-pixel area comprising a second portion of the second border different from the first portion of the second border;
    a third light emitting material in the third sub-pixel area;
    a fourth sub-pixel area in the pixel area, a border of the fourth sub-pixel area comprising the second inner side; and
    the first light emitting material in the fourth sub-pixel area,
    wherein the second outer side of one unit area from among two unit areas adjacent to each other in a column direction from among the plurality of unit areas contacts the first outer side of another unit area from among the two unit areas, and
    wherein each of the border of the second sub-pixel area and the border of the third sub-pixel area has an M-sided polygon shape, where M is equal to 4 or 5, and a side of the border of the second sub-pixel area having the M-sided polygon shape and a side of the border of the third sub-pixel area having the M-sided polygon shape face each other and are parallel to each other.

2. The display device of claim 1, wherein a plurality of pixel columns defined by unit areas from among the plurality of unit areas arranged in the column direction are interlocked with each other, and are arranged along a row direction crossing the column direction.

3. The display device of claim 1, wherein the first border is point-symmetric with respect to a reference point surrounded by the first border.

4. The display device of claim 3, wherein the border of the first sub-pixel area and the border of the fourth sub-pixel area are point-symmetric with each other with respect to the reference point.

5. The display device of claim 3, wherein:
    the first outer side is parallel to a row direction crossing the column direction; and
    the first border is line-symmetric with respect to each of a first reference line passing through the reference point and extending in the row direction, and a second reference line passing through the reference point and extending in the column direction.

6. The display device of claim 5, wherein the border of the first sub-pixel area and the border of the fourth sub-pixel area are line-symmetric with each other with respect to the first reference line.

7. The display device of claim 1, wherein each of all interior angles of the first border and all interior angles of the second border is less than 180 degrees.

8. The display device of claim 1, wherein the first border comprises:
    a third outer side contacting one end of the first outer side;
    a fourth outer side connecting the third outer side to one end of the second outer side;

a fifth outer side contacting another end of the first outer side opposite to the one end of the first outer side; and a sixth outer side connecting the fifth outer side to another end of the second outer side opposite to the one end of the second outer side.

9. The display device of claim 8, wherein the second border comprises:

a third inner side contacting one end of the first inner side;

a fourth inner side connecting the third inner side to one end of the second inner side;

a fifth inner side contacting another end of the first inner side opposite to the one end of the first inner side; and a sixth inner side connecting the fifth inner side to another end of the second inner side opposite to the one end of the second inner side.

10. The display device of claim 9, wherein:

the first inner side and the first outer side are parallel to each other;

the second inner side and the second outer side are parallel to each other;

the third inner side and the third outer side are parallel to each other;

the fourth inner side and the fourth outer side are parallel to each other;

the fifth inner side and the fifth outer side are parallel to each other; and the sixth inner side and the sixth outer side are parallel to each other.

11. The display device of claim 10, wherein:

the first inner side and the first outer side are spaced from each other by a first distance;

the second inner side and the second outer side are spaced from each other by a second distance;

the third inner side and the third outer side are spaced from each other by a third distance;

the fourth inner side and the fourth outer side are spaced from each other by a fourth distance;

the fifth inner side and the fifth outer side are spaced from each other by a fifth distance;

the sixth inner side and the sixth outer side are spaced from each other by a sixth distance; and the first distance, the second distance, the third distance, the fourth distance, the fifth distance, and the sixth distance are equal to each other.

12. The display device of claim 9, wherein:

the border of the second sub-pixel area comprises a portion of the third inner side adjacent to the fourth inner side, and a portion of the fourth inner side adjacent to the third inner side; and the border of the third sub-pixel area comprises a portion of the fifth inner side adjacent to the sixth inner side, and a portion of the sixth inner side adjacent to the fifth inner side.

13. The display device of claim 1, wherein each of the border of the first sub-pixel area and the border of the fourth sub-pixel area has an N-sided polygon shape, where N is equal to 3, 4, 5, or 6.

14. The display device of claim 1, wherein an area of the first sub-pixel area is the same size as that of an area of the fourth sub-pixel area.

15. The display device of claim 1, wherein:

an area of the first sub-pixel area is smaller than an area of the second sub-pixel area, and smaller than an area of the third sub-pixel area; and an area of the fourth sub-pixel area is smaller than the area of the second sub-pixel area, and smaller than the area of the third sub-pixel area.

16. The display device of claim 1, wherein an area of the third sub-pixel area is larger than an area of the second sub-pixel area.

17. The display device of claim 1, wherein:

the first light emitting material is configured to emit light having a first color;

the second light emitting material is configured to emit light having a second color different from the first color; and the third light emitting material is configured to emit light having a third color different from each of the first color and the second color.

18. The display device of claim 17, wherein:

the light of the first color has a peak wavelength in a range of 510 nanometers or more, and 550 nanometers or less;

the light of the second color has a peak wavelength in a range of 610 nanometers or more, and 650 nanometers or less; and the light of the third color has a peak wavelength in a range of 440 nanometers or more, and 480 nanometers or less.

19. A method of manufacturing a display device, comprising:

forming a pixel defining layer comprising:

a plurality of unit areas, each of the plurality of unit areas including a first border having a hexagonal shape comprising:

a first outer side; and a second outer side parallel to the first outer side, and having a length equal to a length of the first outer side; and a pixel area disposed in each of the plurality of unit areas, and including a second border having a hexagonal shape comprising:

a first inner side adjacent to the first outer side; and a second inner side adjacent to the second outer side;

forming a plurality of pixel openings in the pixel defining layer, the plurality of pixel openings comprising:

a first pixel opening defining a first sub-pixel area in the pixel area, a border of the first sub-pixel area comprising the first inner side;

a second pixel opening defining a second sub-pixel area in the pixel area, a border of the second sub-pixel area comprising a first portion of the second border;

a third pixel opening defining a third sub-pixel area in the pixel area, a border of the third sub-pixel area comprising a second portion of the second border different from the first portion of the second border; and a fourth pixel opening defining a fourth sub-pixel area in the pixel area, a border of the fourth sub-pixel area comprising the second inner side;

depositing a first light emitting material in the first pixel opening and the fourth pixel opening;

depositing a second light emitting material in the second pixel opening; and depositing a third light emitting material in the third pixel opening, wherein the second outer side of one unit area from among two unit areas adjacent to each other in a column direction from among the plurality of unit areas contacts the first outer side of another unit area from among the two unit areas, and wherein each of the border of the second sub-pixel area and the border of the third sub-pixel area has an M-sided polygon shape, where M is equal to 4 or 5, and a side of the border of the second sub-pixel area having the M-sided polygon shape and a side of the border of the third sub-pixel area having the M-sided polygon shape face each other and are parallel to each other.

20. The method of claim 19, wherein:
the depositing of the first light emitting material comprises disposing a first mask defining a first opening pattern on the pixel defining layer;
the depositing of the second light emitting material comprises disposing a second mask defining a second opening pattern on the pixel defining layer; and
the depositing of the third light emitting material comprises disposing a third mask defining a third opening pattern on the pixel defining layer.

21. The method of claim 20, wherein the first opening pattern concurrently exposes the fourth sub-pixel area of the one unit area from among the two unit areas and the first sub-pixel area of the other unit area from among the two unit areas.

22. The method of claim 20, wherein:
an area of the first opening pattern is 80% or more, and 120% or less of an area of the third opening pattern; and
an area of the second opening pattern is 80% or more, and 120% or less of the area of the third opening pattern.

* * * * *